(12) United States Patent
Embleton et al.

(10) Patent No.: US 12,004,336 B2
(45) Date of Patent: Jun. 4, 2024

(54) SYSTEM AND METHOD FOR THERMAL MANAGEMENT AND ELECTROMAGNETIC INTERFERENCE MANAGEMENT

(71) Applicant: Dell Products L.P., Hopkinton, MA (US)

(72) Inventors: Steven Embleton, Round Rock, TX (US); Ben John Sy, Austin, TX (US); Eric Michael Tunks, Austin, TX (US); Rene J. Salas, Round Rock, TX (US)

(73) Assignee: DELL PRODUCTS L.P., Hopkinton, MA (US)

( * ) Notice: Subject to any disclaimer, the term of this patent is extended or adjusted under 35 U.S.C. 154(b) by 939 days.

(21) Appl. No.: 16/516,509

(22) Filed: Jul. 19, 2019

(65) Prior Publication Data
US 2021/0022275 A1    Jan. 21, 2021

(51) Int. Cl.
H05K 9/00 (2006.01)
H01Q 17/00 (2006.01)
H05K 7/20 (2006.01)
H05K 7/14 (2006.01)

(52) U.S. Cl.
CPC .......... *H05K 9/0041* (2013.01); *H01Q 17/00* (2013.01); *H05K 7/20136* (2013.01); *H05K 7/20145* (2013.01); *H05K 7/20209* (2013.01); *H05K 7/1487* (2013.01)

(58) Field of Classification Search
CPC ............ H05K 9/0041; H05K 7/20136; H05K 7/20145; H05K 7/20209; H05K 7/1487; H05K 7/20727; H01Q 17/00
See application file for complete search history.

(56) References Cited

U.S. PATENT DOCUMENTS

| | | |
|---|---|---|
| 4,785,136 A | 11/1988 | Mollet et al. |
| 4,858,309 A | 8/1989 | Korsunsky et al. |
| 4,871,220 A | 10/1989 | Kohin |
| 5,049,701 A | 9/1991 | Vowles et al. |
| 5,084,802 A | 1/1992 | Nguyenngoc |
| 5,250,752 A | 10/1993 | Cutright |
| 5,294,748 A | 3/1994 | Schwenk et al. |
| 5,323,298 A | 6/1994 | Shatas et al. |
| 5,343,713 A | 9/1994 | Okabe et al. |
| 5,437,560 A | 8/1995 | Mizuguchi |

(Continued)

OTHER PUBLICATIONS

Yuchang Qing et al., Microwave-Absorbing and mechanical properties of carbonyl-iron/epoxy-silicone resin coatings, Jul. 16, 2008, Journal of Magnetism and Magnetic Materials, vol. 321 Issue 1, pp. 25-28 (Year: 2008).*

(Continued)

*Primary Examiner* — Steven B Mcallister
*Assistant Examiner* — Charles R Brawner
(74) *Attorney, Agent, or Firm* — Chamberlain, Hrdlicka, White, Williams & Aughtry; Aly Z. Dossa

(57) ABSTRACT

A data processing device includes an internal volume for housing electromagnetic interference emitting devices. The data processing device further includes a first electromagnetic radiation absorbing vent. The data processing device further includes a second electromagnetic radiation absorbing vent. The first electromagnetic radiation absorbing vent and the second electromagnetic radiation absorbing vent delineate a gas flow path through the internal volume.

7 Claims, 17 Drawing Sheets

(56) References Cited

U.S. PATENT DOCUMENTS

| | | | |
|---|---|---|---|
| 5,498,968 | A | 3/1996 | Kjebon |
| 5,545,844 | A | 8/1996 | Plummer, III et al. |
| 5,649,831 | A | 7/1997 | Townsend |
| 5,762,513 | A | 6/1998 | Stine |
| 5,812,370 | A | 9/1998 | Moore et al. |
| 5,943,218 | A | 8/1999 | Liu |
| 6,011,221 | A | 1/2000 | Lecinski et al. |
| 6,038,130 | A | 3/2000 | Boeck et al. |
| 6,045,385 | A | 4/2000 | Kane |
| 6,068,009 | A | 5/2000 | Paes et al. |
| 6,087,826 | A | 7/2000 | Donath |
| 6,176,727 | B1 | 1/2001 | Liu et al. |
| 6,208,514 | B1 | 3/2001 | Stark et al. |
| 6,225,554 | B1 | 5/2001 | Trehan et al. |
| 6,242,690 | B1 | 6/2001 | Glover |
| 6,252,161 | B1 * | 6/2001 | Hailey ............ H05K 9/0041 174/383 |
| 6,269,001 | B1 | 7/2001 | Matteson et al. |
| 6,331,940 | B1 | 12/2001 | Lin |
| 6,332,792 | B1 | 12/2001 | Lin et al. |
| 6,370,036 | B1 | 4/2002 | Boe |
| 6,375,361 | B1 | 4/2002 | Falco et al. |
| 6,377,451 | B1 | 4/2002 | Furuya |
| 6,437,987 | B1 | 8/2002 | Lin |
| 6,517,369 | B1 | 2/2003 | Butterbaugh et al. |
| 6,613,977 | B1 | 9/2003 | Fowler |
| 6,657,214 | B1 | 12/2003 | Foegelle et al. |
| 6,695,630 | B1 | 2/2004 | Ku |
| 6,831,844 | B1 | 12/2004 | Lee et al. |
| 6,870,092 | B2 | 3/2005 | Lambert et al. |
| 6,947,290 | B2 | 9/2005 | Hirata |
| 7,035,087 | B2 | 4/2006 | Tan |
| 7,075,796 | B1 | 7/2006 | Pritchett |
| 7,133,296 | B2 | 11/2006 | Choi et al. |
| 7,287,996 | B1 | 10/2007 | Shing |
| 7,371,097 | B1 | 5/2008 | Pennypacker et al. |
| 7,371,977 | B1 | 5/2008 | Preonas |
| 7,692,934 | B2 | 4/2010 | Bartscher et al. |
| 7,695,313 | B2 | 4/2010 | Karim et al. |
| 7,757,847 | B2 | 7/2010 | Tang et al. |
| 8,059,414 | B2 | 11/2011 | Wei |
| 8,098,492 | B2 | 1/2012 | Rosenberg et al. |
| 8,243,469 | B2 | 8/2012 | Jaze et al. |
| 8,310,834 | B2 | 11/2012 | Fürholzer |
| 8,530,756 | B1 | 9/2013 | Winch |
| 8,636,526 | B2 | 1/2014 | Funamura et al. |
| 8,642,900 | B2 | 2/2014 | Nordling et al. |
| 8,662,295 | B2 | 3/2014 | Kubota et al. |
| 8,687,374 | B2 | 4/2014 | Watanabe et al. |
| 8,720,682 | B2 | 5/2014 | Navon et al. |
| 8,760,859 | B2 | 6/2014 | Fuchs et al. |
| 8,969,738 | B2 | 3/2015 | Ross |
| 9,019,711 | B2 | 4/2015 | Tamura |
| 9,095,045 | B2 | 7/2015 | Rojo et al. |
| 9,370,132 | B2 | 6/2016 | Coppola |
| 9,497,894 | B1 | 11/2016 | Ramsey |
| 9,549,480 | B1 | 1/2017 | Besterman |
| 9,585,270 | B2 | 2/2017 | Yang et al. |
| 9,603,280 | B2 | 3/2017 | Frank et al. |
| 9,607,660 | B2 | 3/2017 | Bennett, II et al. |
| 9,640,910 | B1 | 5/2017 | Chien et al. |
| 9,642,290 | B2 | 5/2017 | Anderson et al. |
| 9,696,410 | B1 | 7/2017 | Lee et al. |
| 9,820,404 | B1 | 11/2017 | Wu et al. |
| 9,829,939 | B1 | 11/2017 | Lien et al. |
| 9,930,816 | B2 | 3/2018 | Winch et al. |
| 10,249,984 | B1 | 4/2019 | Rask |
| 10,364,031 | B2 | 7/2019 | Goupil |
| 10,420,258 | B1 | 9/2019 | Rahilly et al. |
| 10,477,740 | B2 | 11/2019 | Coppola |
| 10,477,741 | B1 | 11/2019 | Bae et al. |
| 10,492,324 | B2 | 11/2019 | Miura |
| 10,520,532 | B2 | 12/2019 | Lee |
| 10,541,519 | B1 | 1/2020 | Wavering |
| 10,542,642 | B2 | 1/2020 | Babhadiashar et al. |
| 10,575,443 | B2 | 2/2020 | Woodbury, II et al. |
| 10,707,636 | B2 | 7/2020 | Yamamoto |
| 10,720,722 | B2 | 7/2020 | Tsorng et al. |
| 10,734,763 | B2 | 8/2020 | M R et al. |
| 10,917,996 | B1 | 2/2021 | Embleton et al. |
| 10,980,159 | B2 | 4/2021 | Embleton et al. |
| 11,143,682 | B2 | 10/2021 | Embleton et al. |
| 11,513,934 | B2 | 11/2022 | Embleton et al. |
| 2002/0000645 | A1 | 1/2002 | Sato et al. |
| 2002/0001181 | A1 | 1/2002 | Kondo |
| 2002/0027769 | A1 | 3/2002 | Kasahara et al. |
| 2002/0064035 | A1 | 5/2002 | Mair et al. |
| 2003/0011988 | A1 | 1/2003 | Irmer |
| 2003/0042990 | A1 * | 3/2003 | Schumacher ........ H05K 7/1449 333/248 |
| 2003/0057131 | A1 | 3/2003 | Diaferia |
| 2003/0137811 | A1 | 7/2003 | Ling et al. |
| 2003/0174474 | A1 | 9/2003 | Mair et al. |
| 2003/0174487 | A1 | 9/2003 | Garmong |
| 2003/0192715 | A1 * | 10/2003 | Lambert ............ H05K 9/0041 174/355 |
| 2004/0001299 | A1 * | 1/2004 | van Haaster ........ G02B 6/4277 257/E23.114 |
| 2004/0020674 | A1 * | 2/2004 | McFadden ........... H05K 9/0088 174/394 |
| 2006/0025010 | A1 | 2/2006 | Spitaels et al. |
| 2007/0105445 | A1 | 5/2007 | Manto et al. |
| 2007/0147013 | A1 | 6/2007 | Robbins |
| 2008/0076291 | A1 | 3/2008 | Ewing et al. |
| 2009/0021925 | A1 | 1/2009 | Heimann |
| 2009/0095523 | A1 | 4/2009 | Stevenson |
| 2009/0146862 | A1 * | 6/2009 | Malone ............... H05K 9/0045 181/141 |
| 2010/0208433 | A1 | 8/2010 | Heimann et al. |
| 2010/0285636 | A1 | 11/2010 | Chen |
| 2010/0319981 | A1 | 12/2010 | Kapusta et al. |
| 2011/0011760 | A1 | 1/2011 | Habersetzer |
| 2011/0198245 | A1 | 8/2011 | Soufan |
| 2011/0222249 | A1 | 9/2011 | Ruehl et al. |
| 2011/0232956 | A1 | 9/2011 | Ramsey |
| 2012/0011700 | A1 | 1/2012 | Kelaher et al. |
| 2012/0044653 | A1 | 2/2012 | Morris et al. |
| 2012/0073873 | A1 | 3/2012 | Nash |
| 2012/0178364 | A1 | 7/2012 | Dobyns |
| 2012/0285738 | A1 | 11/2012 | Cochrane et al. |
| 2013/0032310 | A1 | 2/2013 | Jaena et al. |
| 2013/0065454 | A1 * | 3/2013 | Milbrand, Jr. ...... H01R 13/6583 439/676 |
| 2013/0160563 | A1 | 6/2013 | Dingler et al. |
| 2013/0194772 | A1 | 8/2013 | Rojo et al. |
| 2013/0206470 | A1 | 8/2013 | Davis |
| 2013/0277520 | A1 | 10/2013 | Funk et al. |
| 2014/0008119 | A1 | 1/2014 | Brandt |
| 2014/0138388 | A1 | 5/2014 | Synnestvedt |
| 2014/0367923 | A1 | 12/2014 | Schaaf et al. |
| 2014/0368821 | A1 | 12/2014 | Gazaway et al. |
| 2015/0014912 | A1 | 1/2015 | Ivey et al. |
| 2015/0245529 | A1 | 8/2015 | Tam et al. |
| 2015/0271959 | A1 | 9/2015 | Chen et al. |
| 2015/0368423 | A1 | 12/2015 | Yamauchi et al. |
| 2015/0373869 | A1 | 12/2015 | Macerini et al. |
| 2016/0098561 | A1 | 4/2016 | Keller et al. |
| 2016/0111814 | A1 | 4/2016 | Hirano et al. |
| 2016/0159480 | A1 | 6/2016 | Barth |
| 2016/0182130 | A1 | 6/2016 | Ahmed et al. |
| 2016/0372948 | A1 | 12/2016 | Kvols |
| 2016/0381818 | A1 | 12/2016 | Mills et al. |
| 2017/0049011 | A1 * | 2/2017 | Durant ............... H05K 9/0081 |
| 2017/0071063 | A1 * | 3/2017 | Sizemore ............ H05K 9/0041 |
| 2017/0181314 | A1 | 6/2017 | Leigh et al. |
| 2017/0347496 | A1 | 11/2017 | Smith |
| 2018/0062287 | A1 | 3/2018 | Shaw et al. |
| 2018/0249600 | A1 * | 8/2018 | Coppola ............ H05K 7/20209 |
| 2018/0257334 | A1 | 9/2018 | Motoyanagi et al. |
| 2019/0008079 | A1 | 1/2019 | Kondo et al. |
| 2019/0050030 | A1 | 2/2019 | Baum |
| 2019/0056439 | A1 | 2/2019 | Lee |
| 2019/0159371 | A1 | 5/2019 | Grinsteinner |
| 2019/0230828 | A1 | 7/2019 | Murch |

(56) References Cited

U.S. PATENT DOCUMENTS

| | | | |
|---|---|---|---|
| 2019/0254191 A1* | 8/2019 | Chang | H05K 7/20172 |
| 2019/0304922 A1 | 10/2019 | Maruthamuthu et al. | |
| 2019/0353356 A1 | 11/2019 | Fischer | |
| 2019/0364701 A1 | 11/2019 | Rahilly et al. | |
| 2019/0379183 A1 | 12/2019 | Winsor | |
| 2020/0187394 A1 | 6/2020 | Murugesan | |
| 2020/0187578 A1 | 6/2020 | Sadato | |
| 2020/0313584 A1 | 10/2020 | Morel et al. | |
| 2021/0022277 A1 | 1/2021 | Embleton et al. | |

OTHER PUBLICATIONS

"Full HD Endoscopes"; joimax® GmbH, May 1, 2019; https://web.archive.org/web/20190501003355/https://www.joimax.com/en/products/electronic-devices/hd_endoscopes/.

"JRE 0814 RF Shielded Test Enclosure"; JRE Test, LLC, Apr. 22, 2019; https://web.archive.org/web/20190422094016/https://jretest.com/product/jre-0814/.

"Tapster"; Tapster Robotics, Inc., Sep. 30, 2017; https://web.archive.org/web/20170930111059/https://www.tapster.io/.

David G. Wang, James L. Knighten, And P. Keith Muller, An Integrated Vent, Heatsink and EMI Shield, An Integrated Vent, Heatsink and EMI Shield, 2002, pp. 1-7, 2002 (7 pages).

David Zhou, Ming Zhang, Chris Du, Enhancing Rack Servers Air Cooling Capability with Extra System Inlet Airflow through Air Ducts between Racks, Enhancing Rack Servers Air Cooling Capability with Extra System Inlet Airflow through Air Ducts between Racks, 2017, pp. 1-7, 2017 (7 pages).

Gary Fenical; "Rule-of-Thumb for Calculating Aperture Size"; Laird Technologies; Mar. 2003 (http://cdn.lairdtech.com/home/brandworld/files/EMI%20Rule-of-Thumb%20for%20Calculating%20Aperture%20Size%20Technical%20Note%20Download.pdf).

* cited by examiner

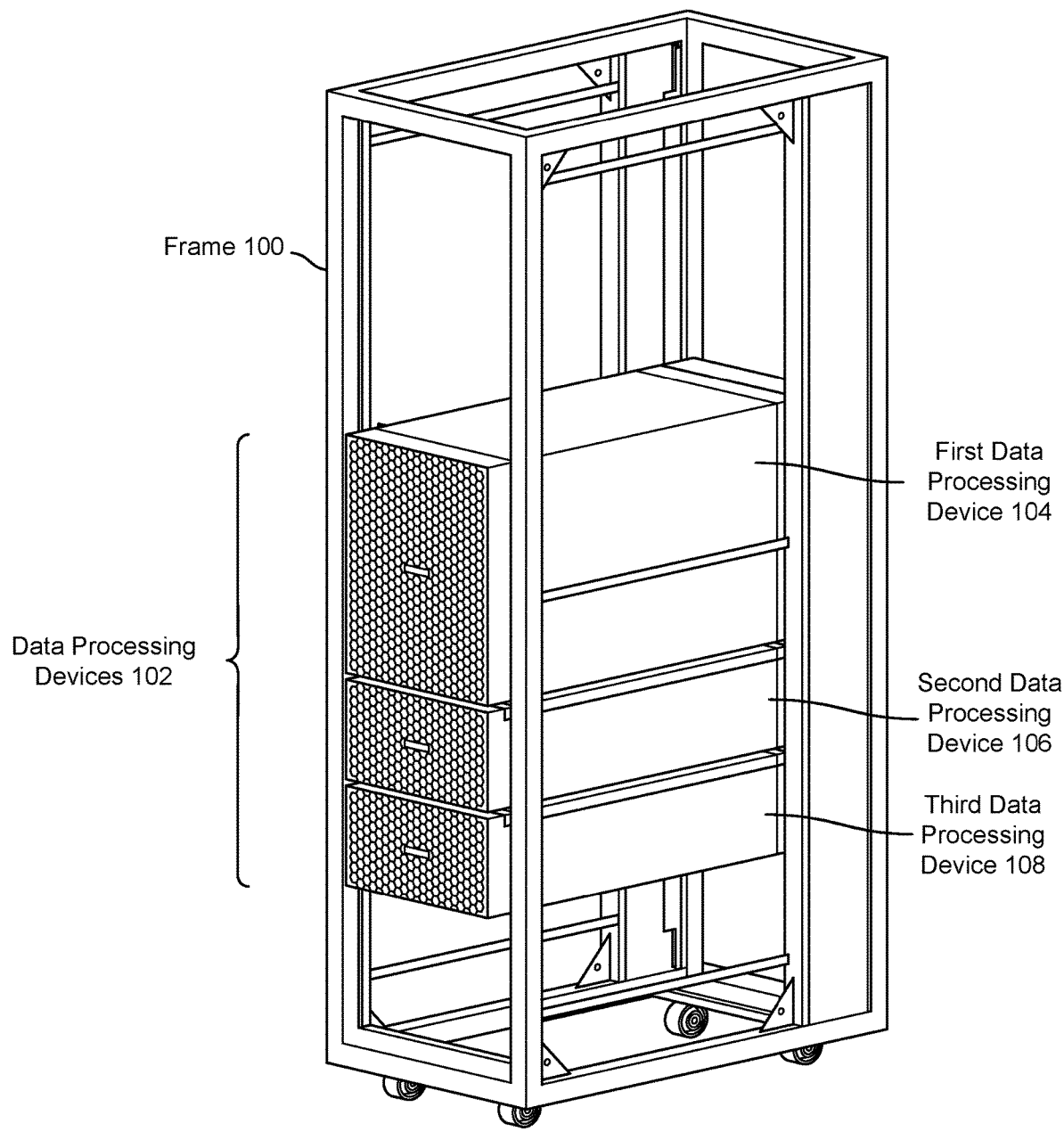
FIG. 1.1

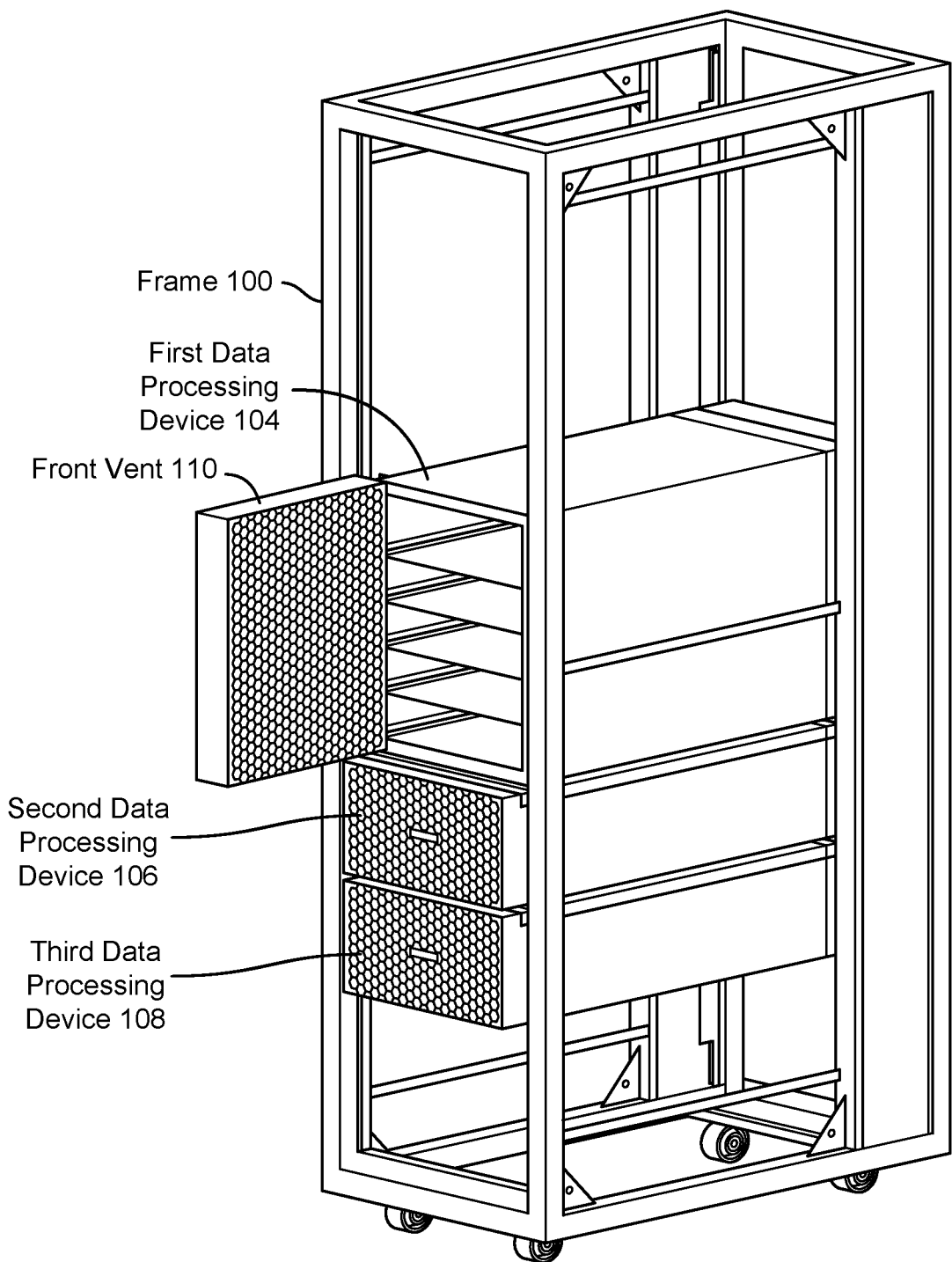
FIG. 1.2

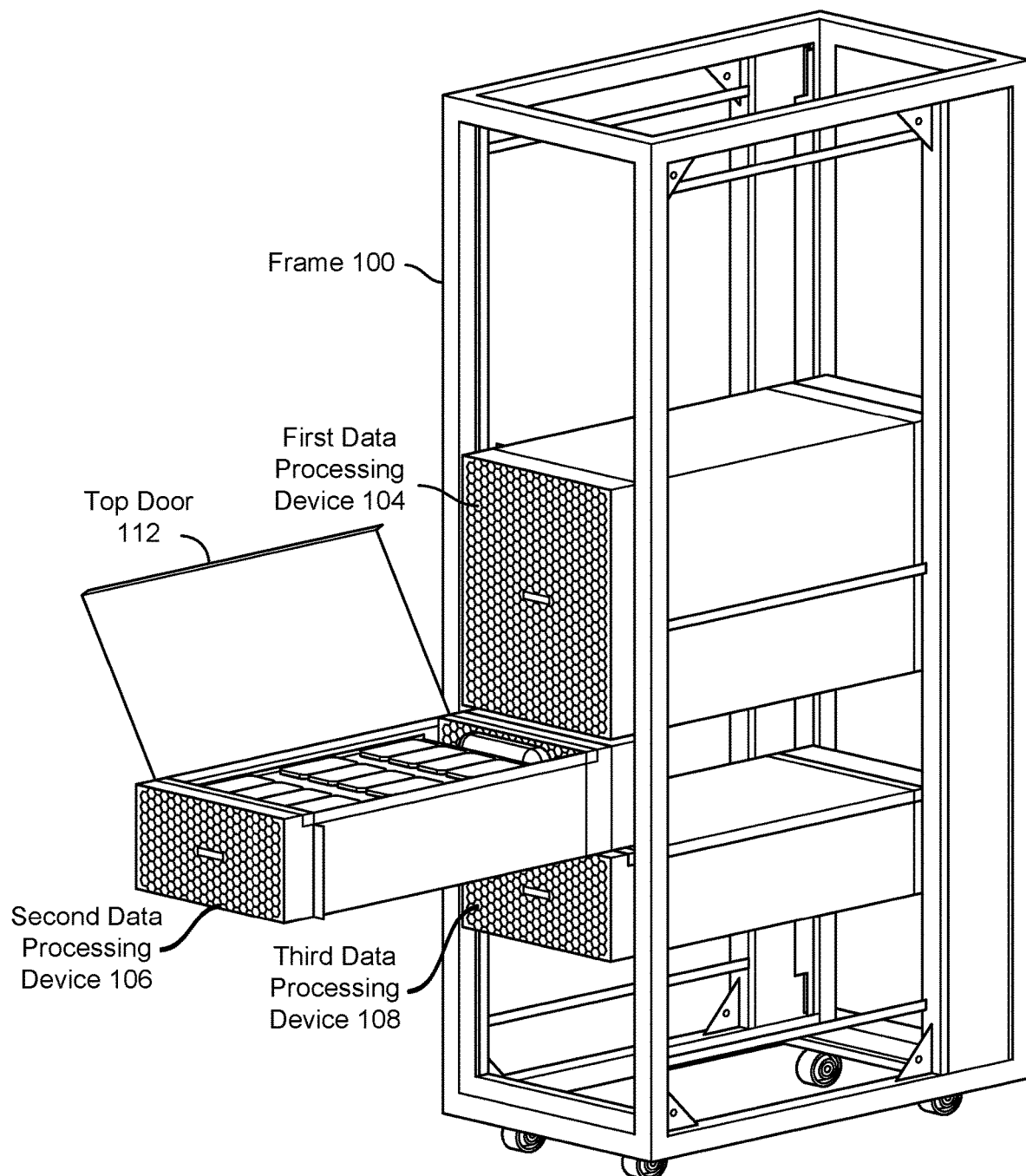
FIG. 1.3

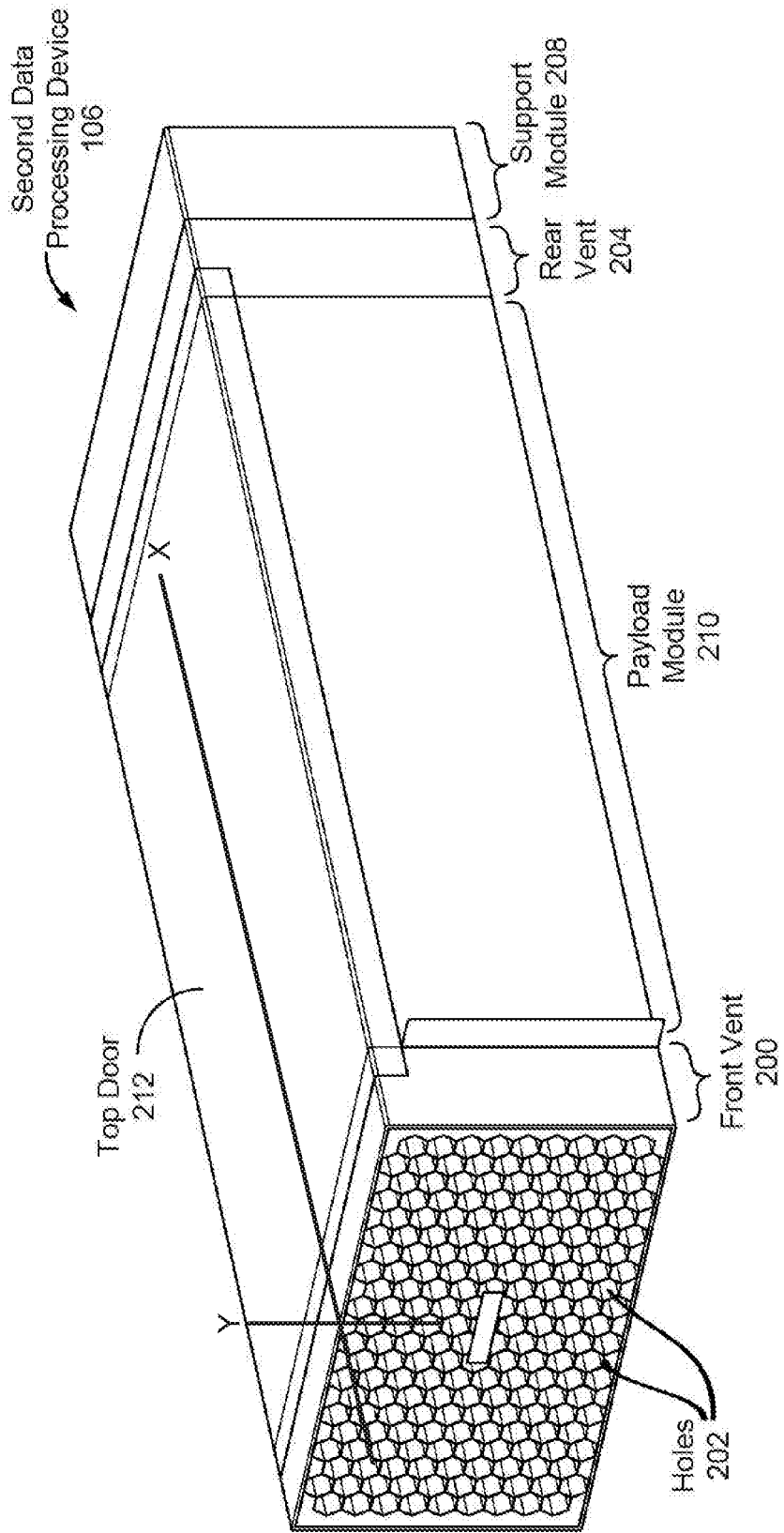
FIG. 2.1

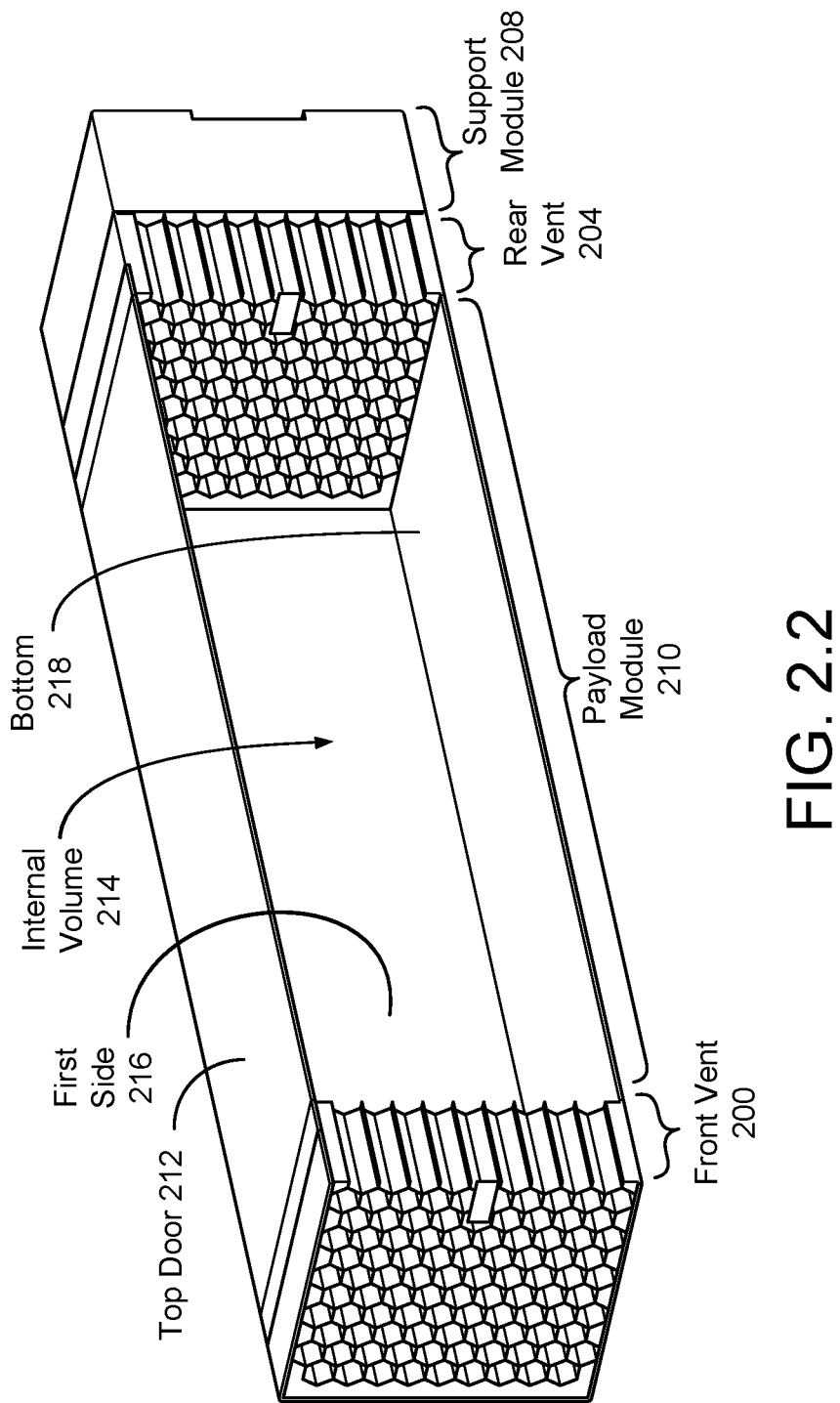
FIG. 2.2

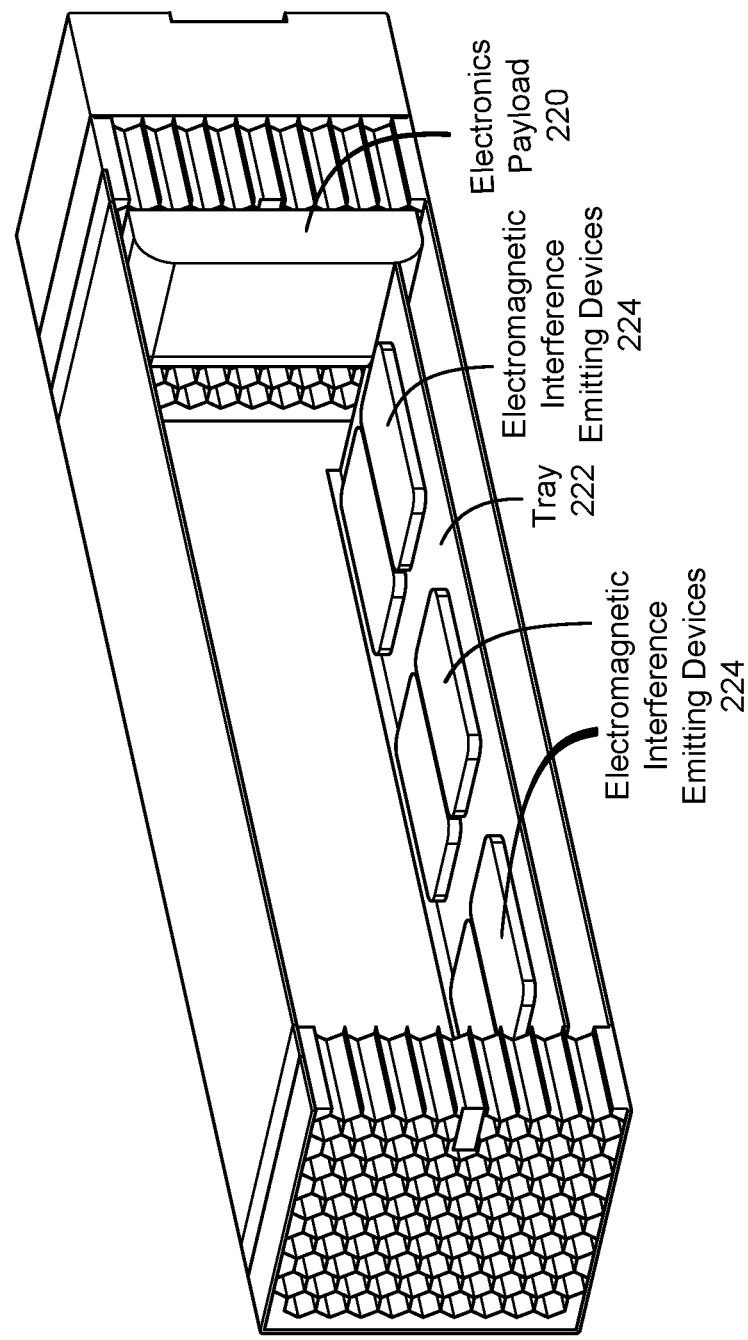
FIG. 2.3

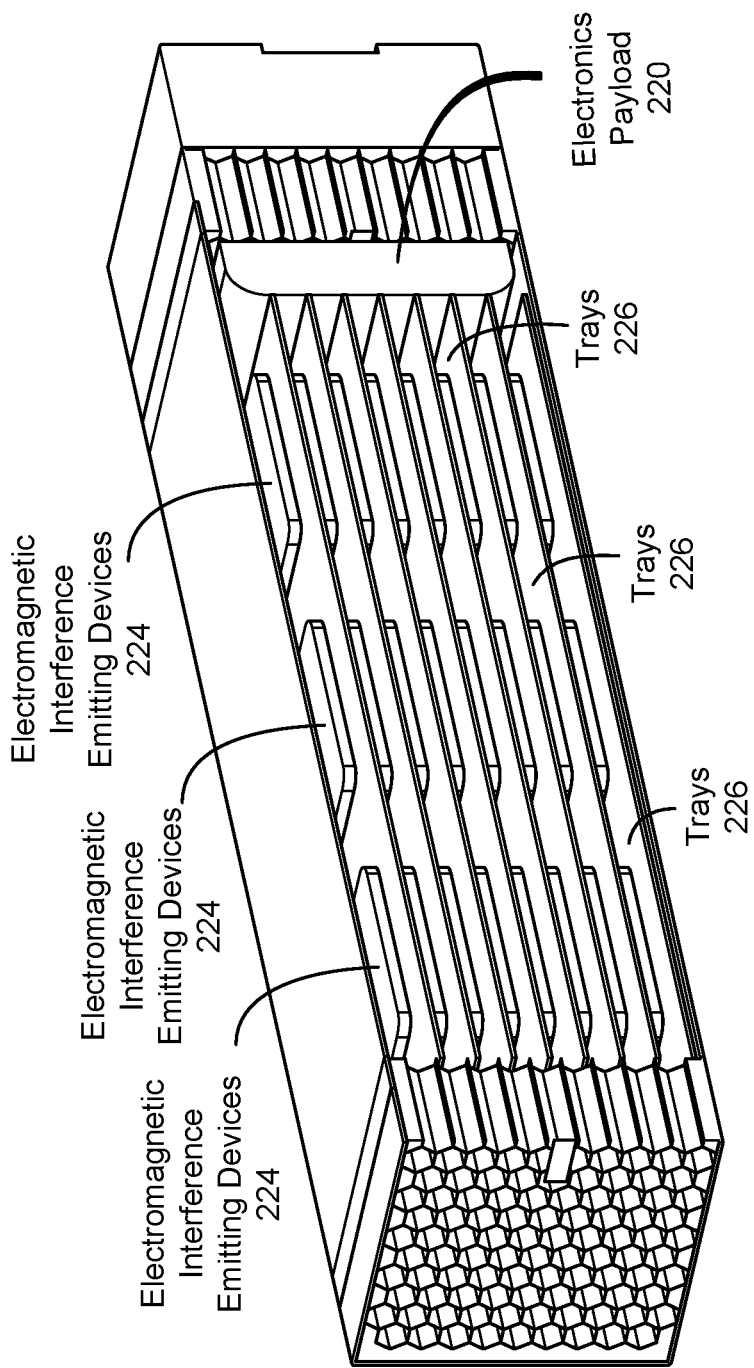
FIG. 2.4

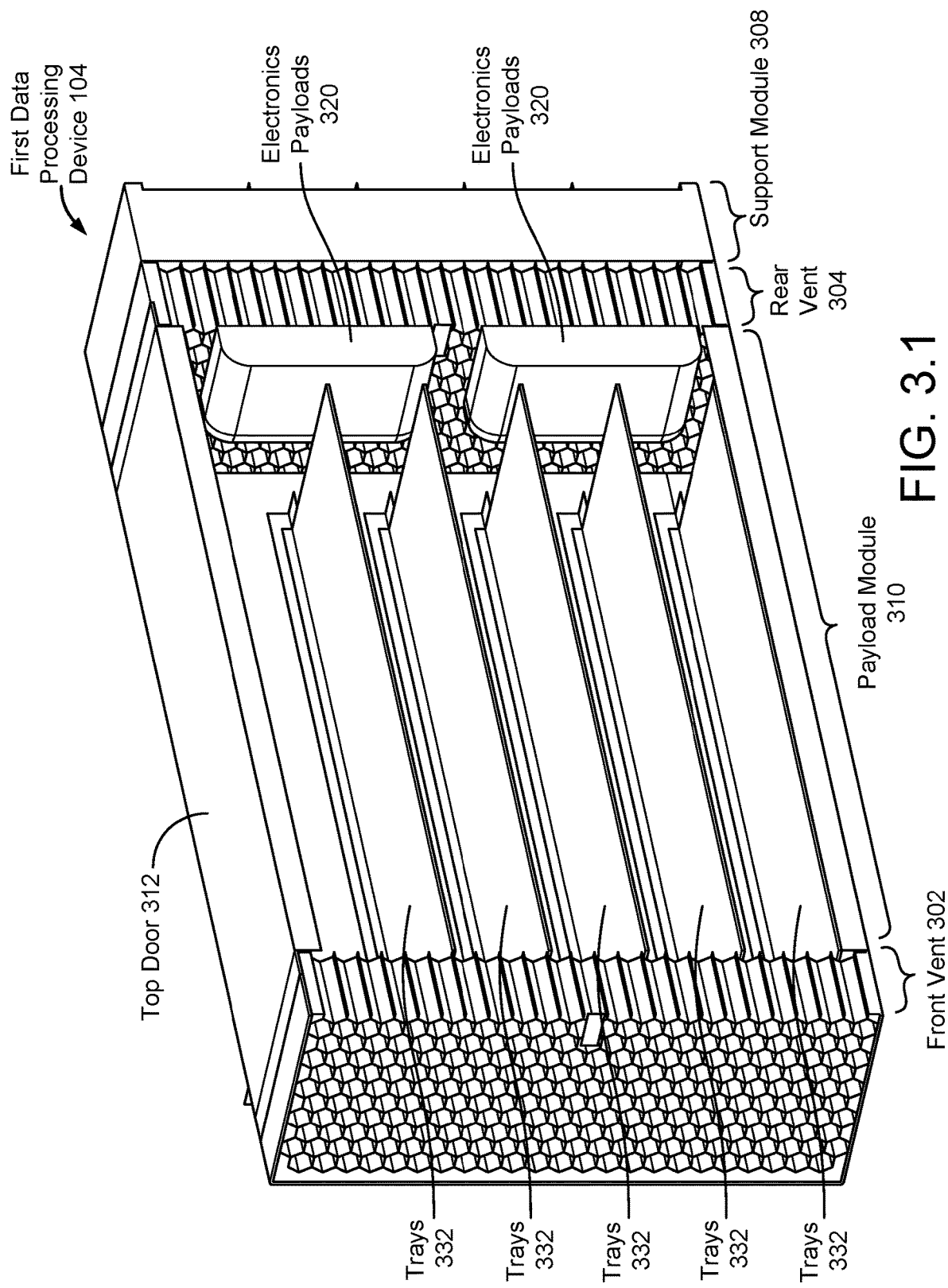
FIG. 3.1

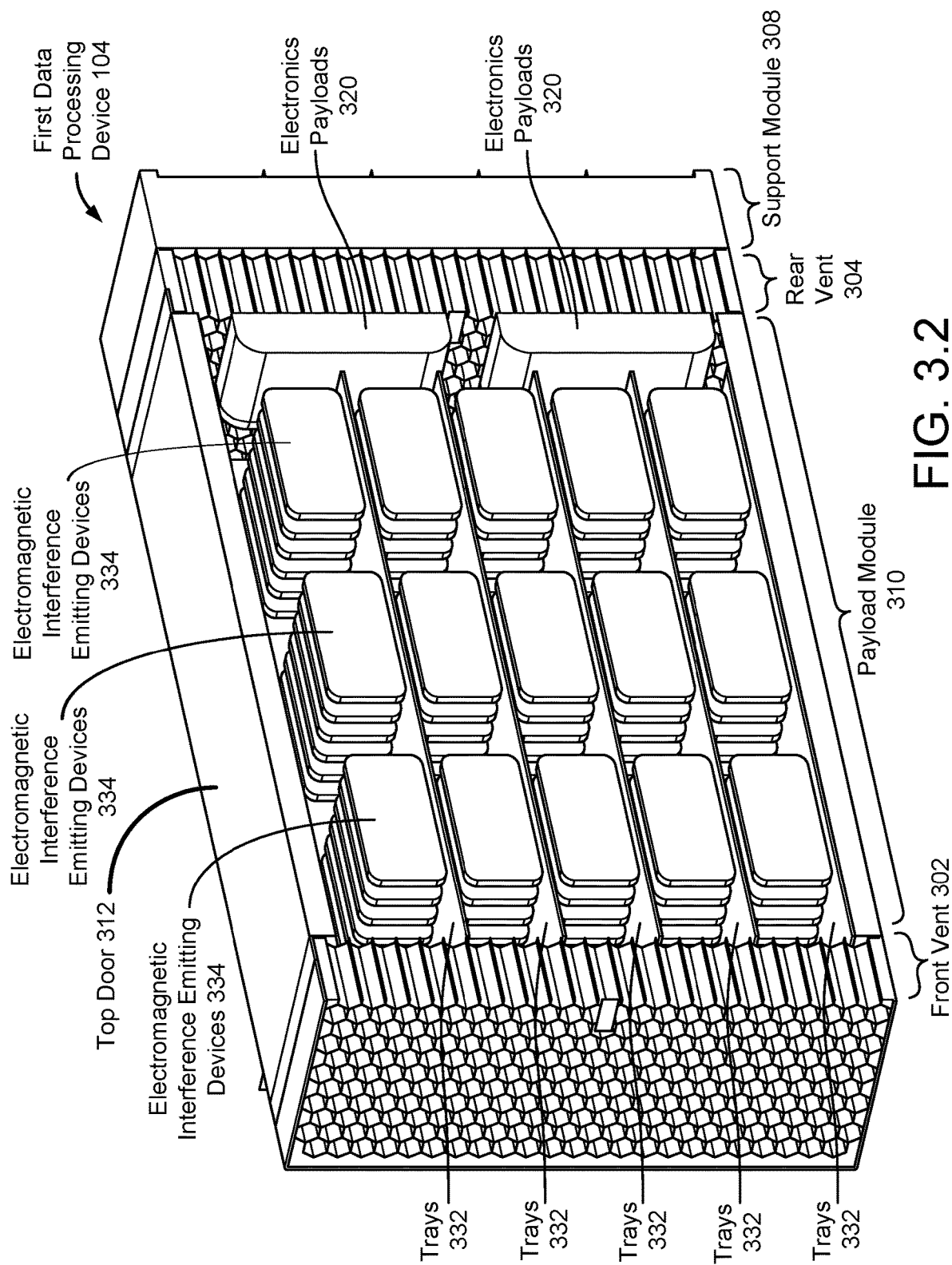
FIG. 3.2

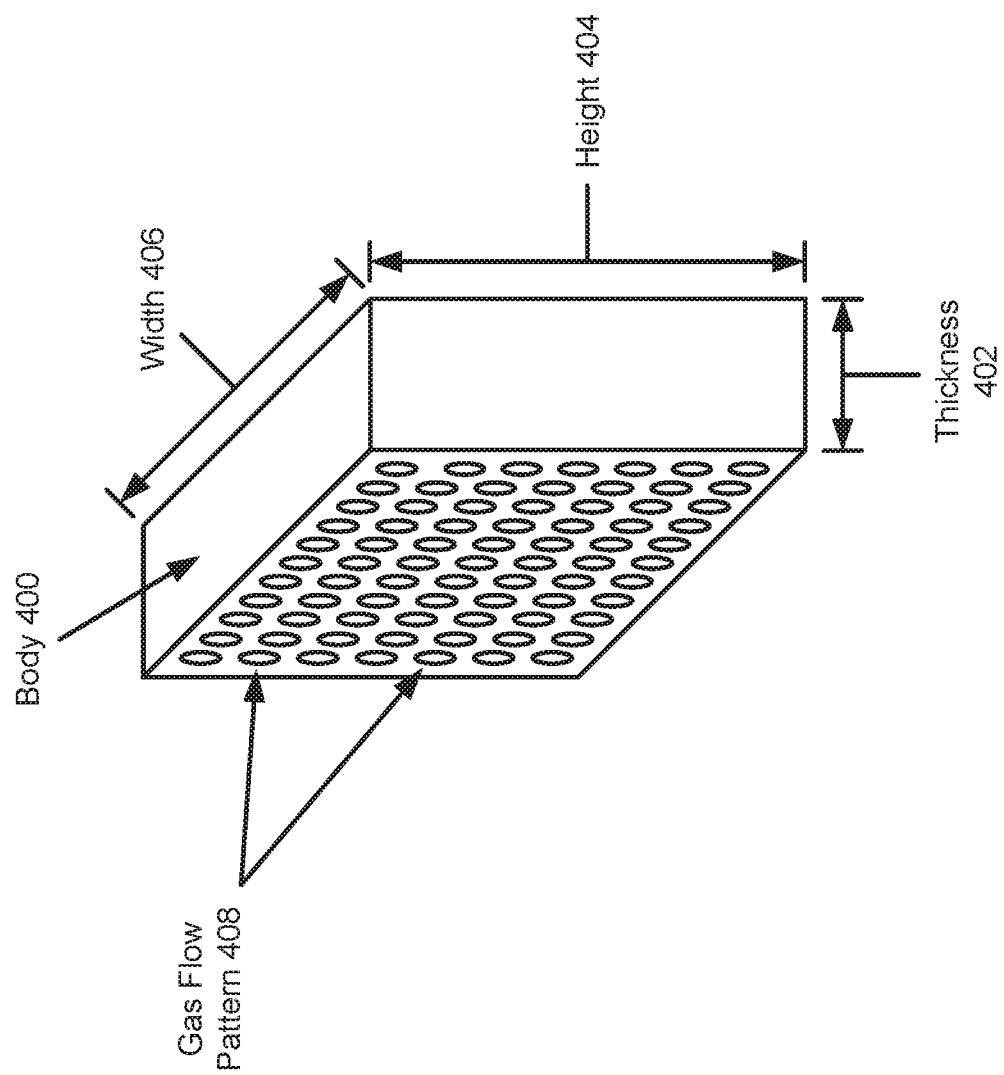
FIG. 4.1

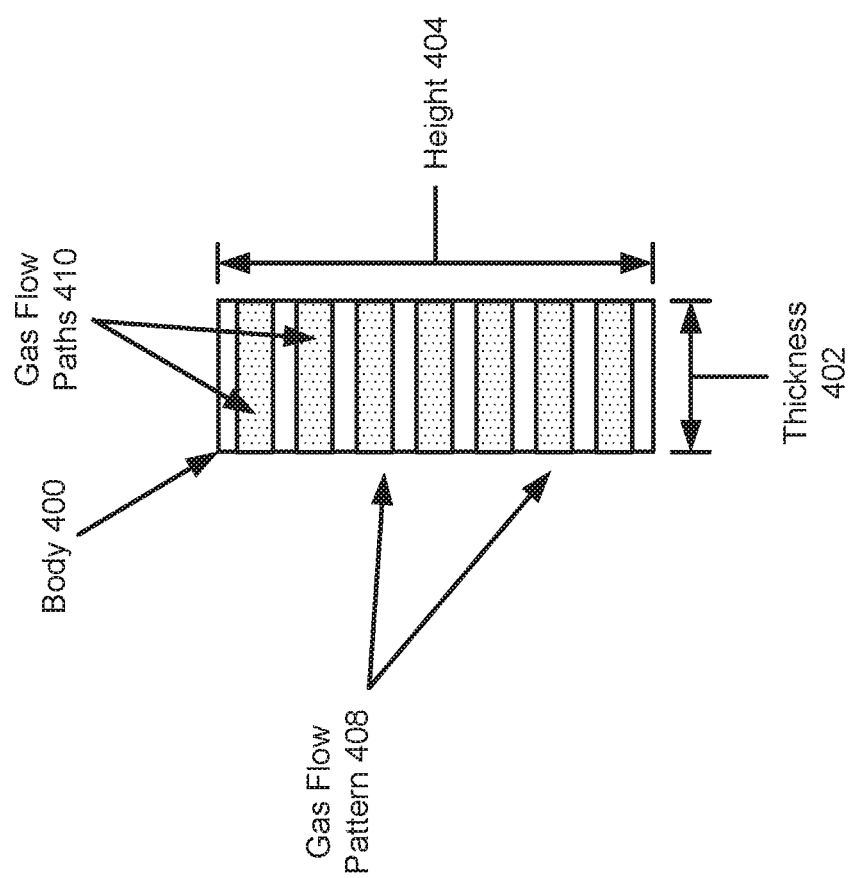
FIG. 4.2

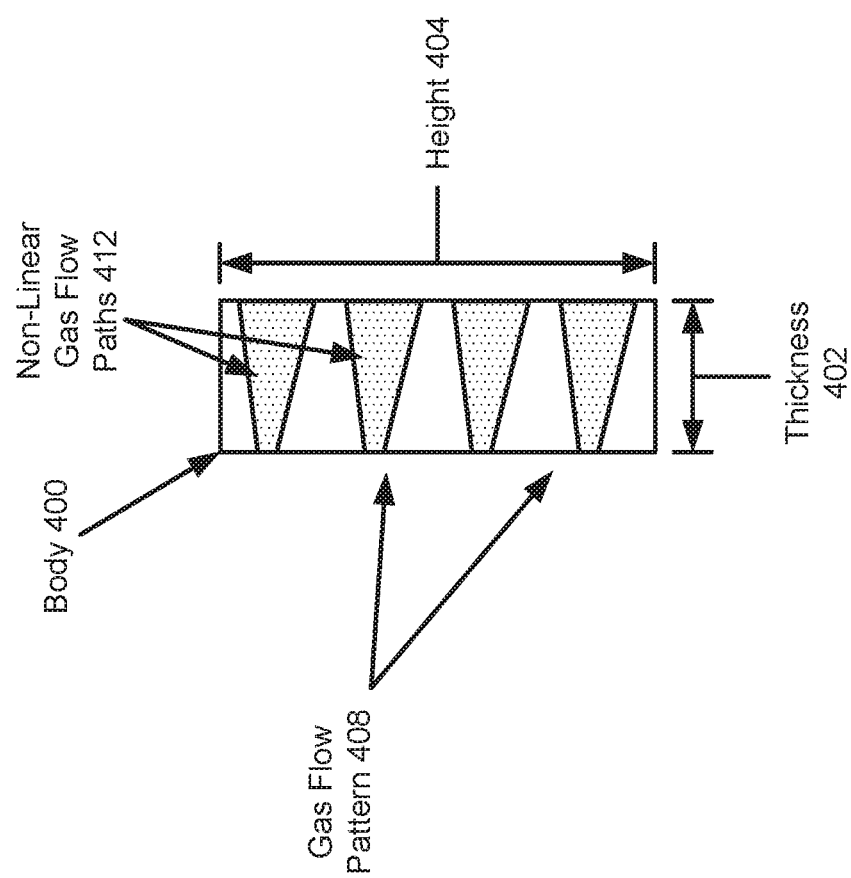

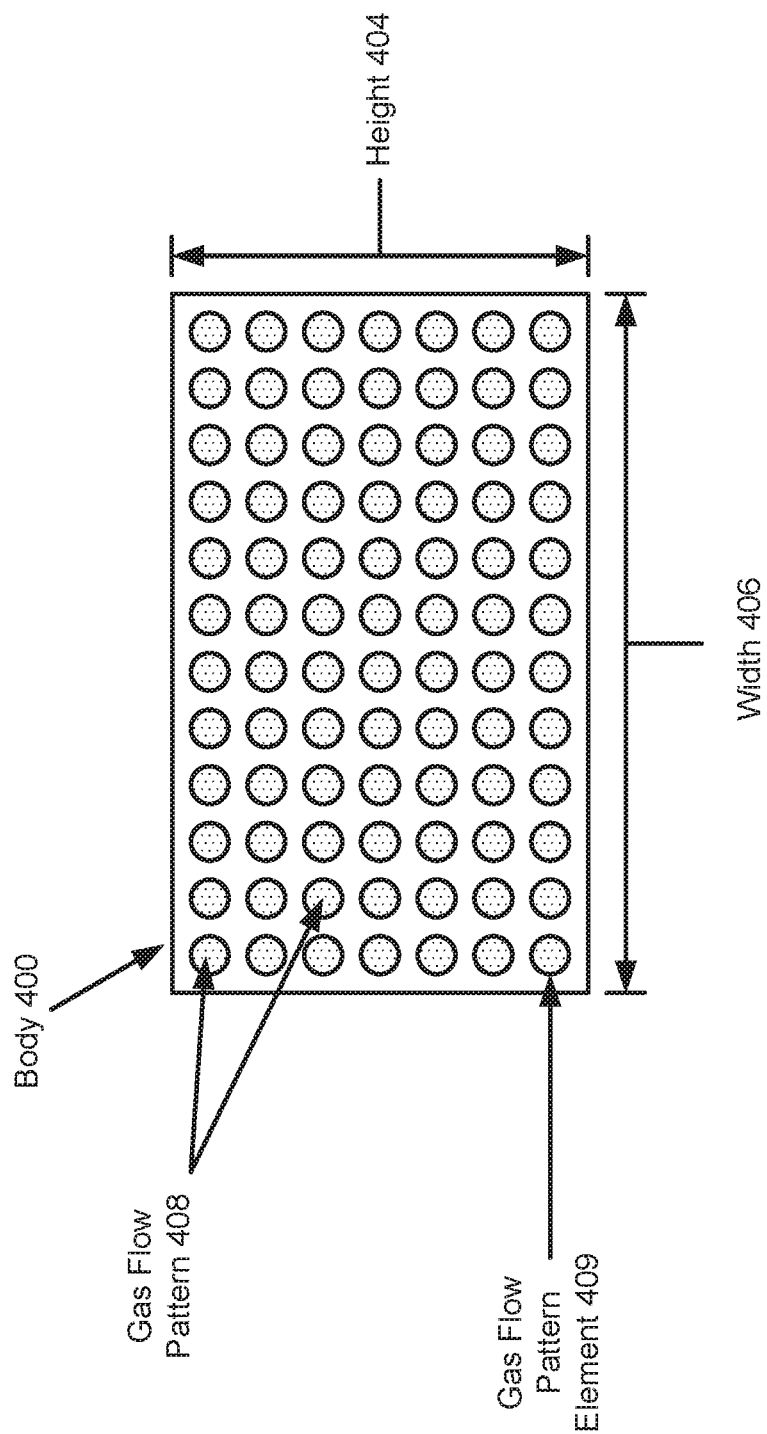
FIG. 4.4

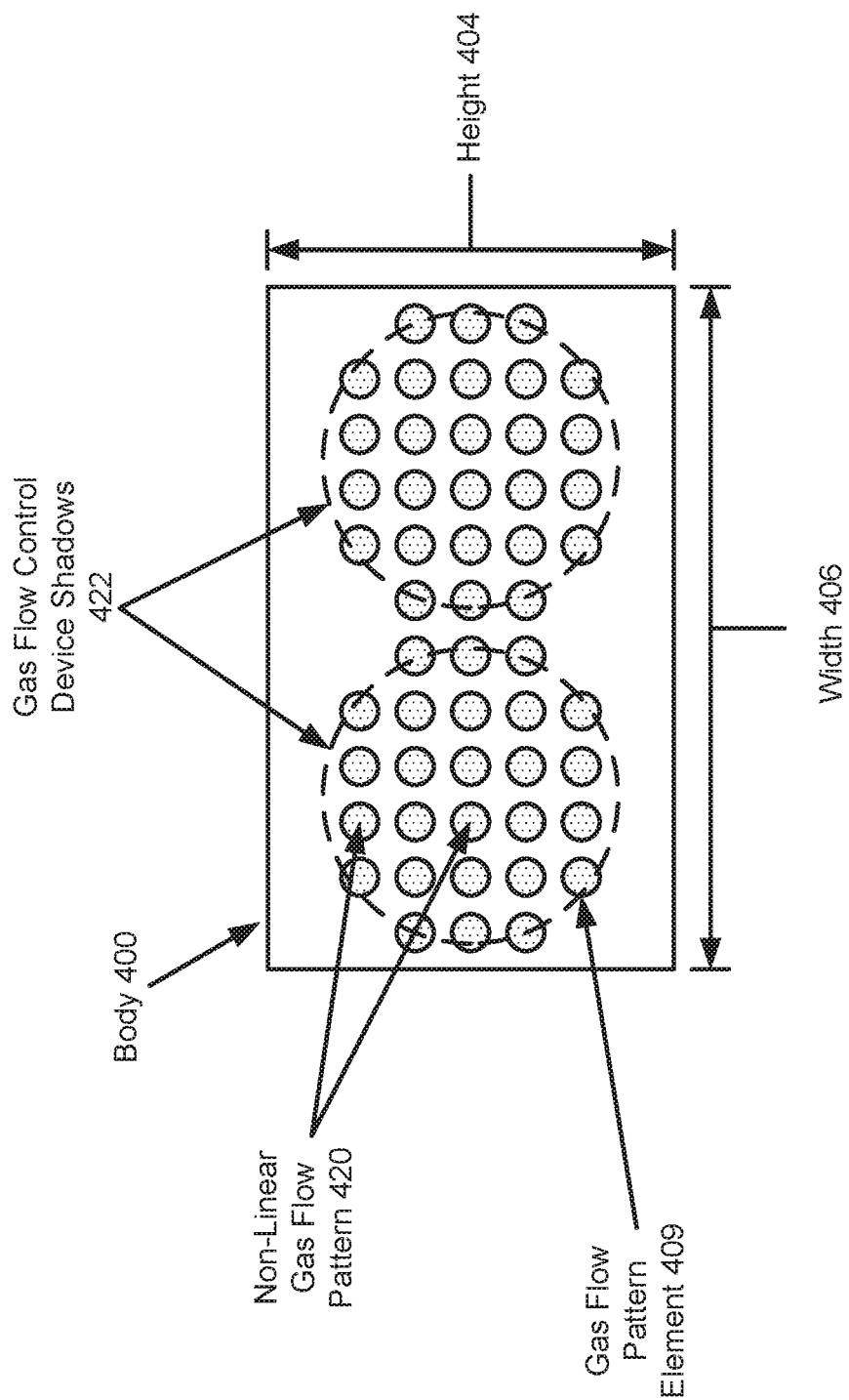
FIG. 4.5

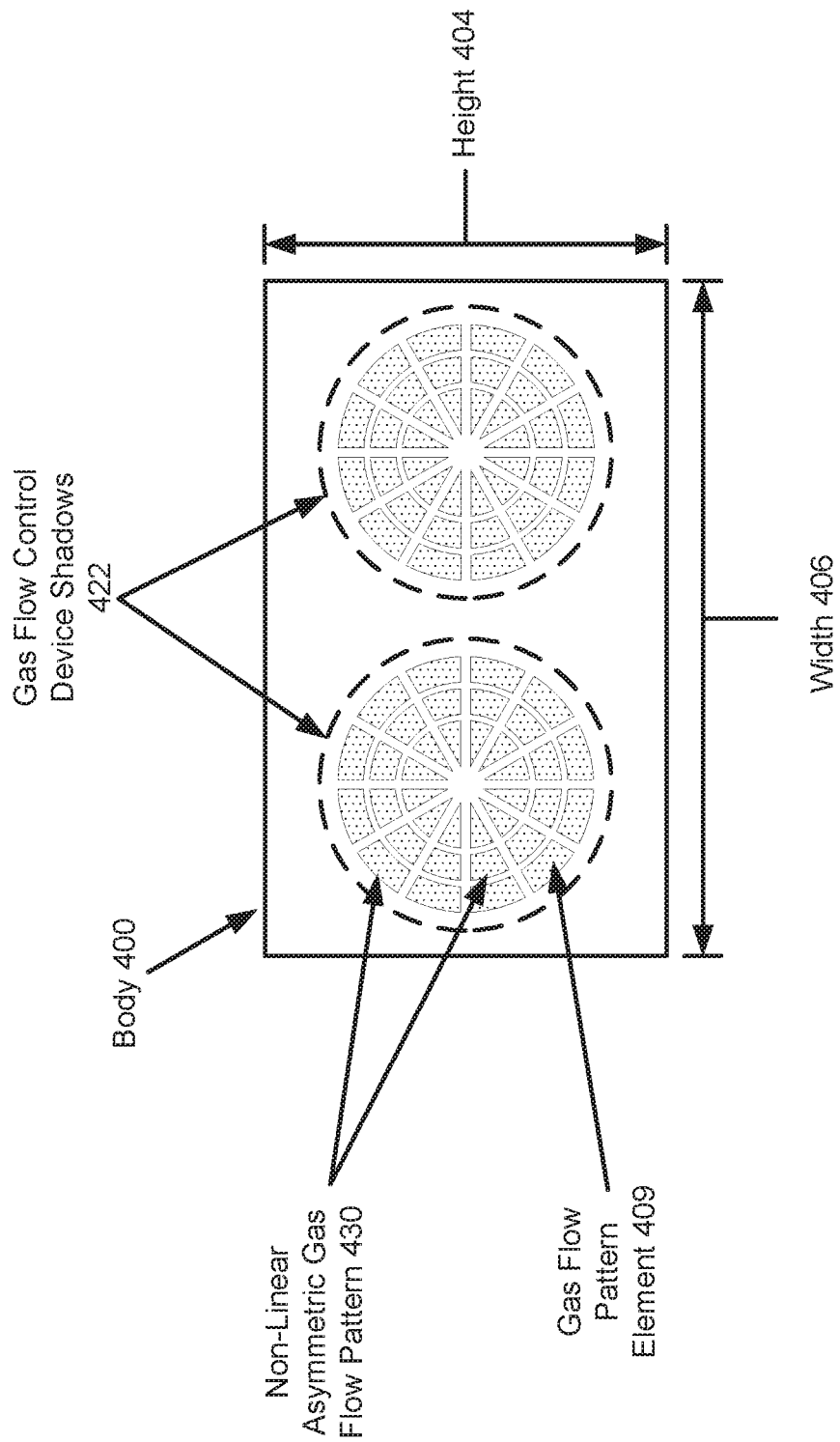
FIG. 4.6

SYSTEM AND METHOD FOR THERMAL MANAGEMENT AND ELECTROMAGNETIC INTERFERENCE MANAGEMENT

BACKGROUND

A high density environment may include devices that are tightly packed together. In other words, the devices may be physically close to each other. Such an environment may present numerous challenges relating to thermal management, mechanical positioning and orienting of devices, and electrical concerns related to power and operation of such devices.

SUMMARY

In one aspect, a data processing device in accordance with one or more embodiments of the invention includes an internal volume for housing electromagnetic interference (EMI) emitting devices; and two electromagnetic radiation (EMR) absorbing vents that delineate a gas flow path through the internal volume.

In one aspect, a method for managing a data processing device in accordance with one or more embodiments of the invention includes monitoring a thermal state of an electromagnetic interference (EMI) emitting device disposed in an EMI suppressed internal volume of the data processing device; and managing the thermal state of the EMI emitting device based on the monitoring by modulating a rate of gas flow that: traverses through the EMI suppressed internal volume, and is proximate to the EMI emitting device. The EMI suppressed internal volume is delineated by two electromagnetic radiation (EMR) absorbing vents.

In one aspect, a non-transitory computer readable medium in accordance with one or more embodiments of the invention stores computer instructions which, when executed, cause a method for managing a data processing device to be performed, the method includes monitoring a thermal state of an electromagnetic interference (EMI) emitting device disposed in an EMI suppressed internal volume of the data processing device; and managing the thermal state of the EMI emitting device based on the monitoring by modulating a rate of gas flow that: traverses through the EMI suppressed internal volume, and is proximate to the EMI emitting device. The EMI suppressed internal volume is delineated by two electromagnetic radiation (EMR) absorbing vents.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 1.1 shows a diagram of an example system in accordance with one or more embodiments of the invention.

FIG. 1.2. shows a diagram of the example system of FIG. 1.1 in a first configuration in accordance with one or more embodiments of the invention.

FIG. 1.3 shows a diagram of the example system of FIG. 1.1 in a second configuration in accordance with one or more embodiments of the invention.

FIG. 2.1 shows a diagram of a second data processing device in accordance with one or more embodiments of the invention.

FIG. 2.2 shows a first cut-view diagram of the data processing device of FIG. 2.1.

FIG. 2.3 shows a second cut-view diagram of the data processing device of FIG. 2.1.

FIG. 2.4 shows a third cut-view diagram of the data processing device of FIG. 2.1.

FIG. 3.1 shows a first cut-view diagram of a first data processing device in accordance with one or more embodiments of the invention.

FIG. 3.2 shows a second cut-view diagram of the first data processing device of FIG. 3.1.

FIG. 4.1 shows a diagram of an example vent in accordance with one or more embodiments of the invention.

FIG. 4.2 shows a first cross section diagram of the example vent of FIG. 4.1.

FIG. 4.3 shows a second cross section diagram of the example vent of FIG. 4.1.

FIG. 4.4 shows a first front view diagram of the example vent of FIG. 4.1.

FIG. 4.5 shows a second front view diagram of the example vent of FIG. 4.1.

FIG. 4.6 shows a third front view diagram of the example vent of FIG. 4.1.

DETAILED DESCRIPTION

Figure 5:
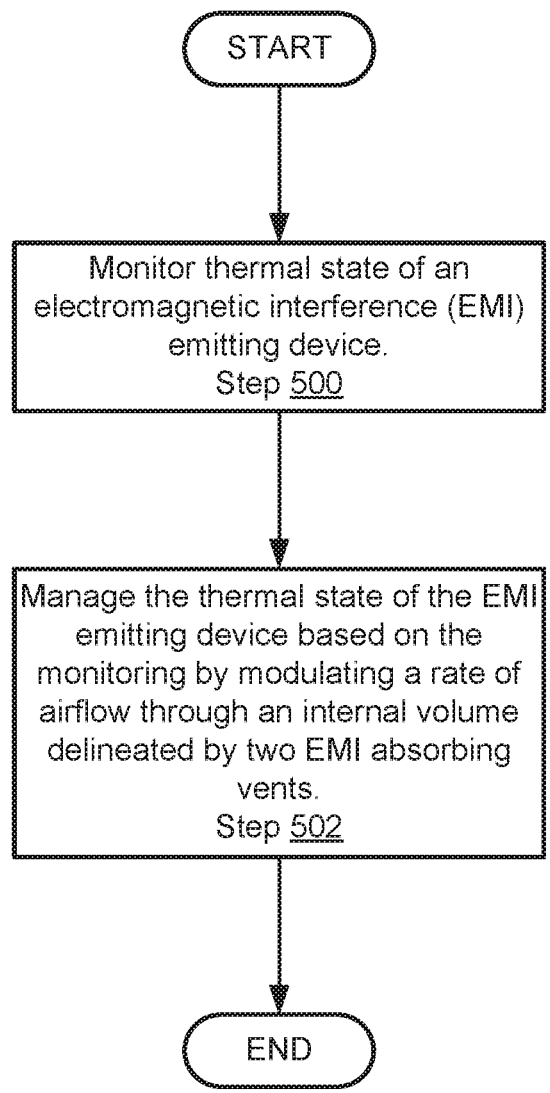
FIG. 5 shows a flowchart of a method of managing a thermal state of an electromagnetic interference emitting device in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing electromagnetic interference in a high-density environment. Specifically, embodiments of the invention may provide a system that manages electromagnetic interference at a data processing device level. By doing so, embodiments of the invention may facilitate the inclusion of electromagnetic interference emitting devices in a high-density environment while mitigating the impact of electromagnetic interference generated by the electromagnetic interference emitting devices.

In one or more embodiments of the invention, a data processing device includes an internal volume for housing any number of electromagnetic interference emitting devices. The data processing devices may isolate the electromagnetic interference emitting devices from the ambient environment proximate to the data processing device by at least 90 decibels (or another suitable level). For example, a data processing device in accordance with embodiments of the invention may provide greater than 35 decibels of isolation, between 35-50 decibels of isolation, between 50-65 decibels of isolation, between 65-80 decibels of isolation, and/or greater than 80 decibels of isolation.

The data processing devices may also facilitate the insertion, removal, and/or modification of electromagnetic interference emitting devices while maintaining the electromagnetic isolation of the aforementioned devices from the ambient environment.

To isolate the electromagnetic interference emitting devices from the ambient environment while enabling gasses to flow through the internal volume for thermal management purposes, the internal volume may be bounded by two vents. The vents may attenuate, rather than reflect, electromagnetic radiation. The vents may be formed from a reversibly deformable material that is electromagnetically lossy at appropriate frequencies to attenuate electromagnetic radiation produced by the electromagnetic interference emitting device. The gasses may be air or another type/combination of gasses obtained from any source.

By doing so, such electromagnetic interference emitting devices may be utilized, in a high-density setting, while mitigating the potential impact on the high-density environment due to the inclusion of such devices in the environment.

FIG. 1.1 shows an example system in accordance with one or more embodiments of the invention. The system may include a frame (100) and any number of data processing devices (102). The components of the example system may provide electromagnetic interference management services for devices disposed within the data processing devices (102). By doing so, devices that emit electromagnetic interference may be utilized in a high-density computing environment without negatively impacting the high-density computing environment.

For example, one or more electromagnetic interference emitting devices may be disposed within one or more of the data processing devices (102). The system illustrated in FIG. 1.1 may manage the electromagnetic interference generated by the one or more electromagnetic interference emitting devices by (i) limiting the space in which electromagnetic interference is allowed to freely propagate and/or (ii) attenuating the electromagnetic interference as it propagates out of the limited space.

To do so, the system of FIG. 1.1 may reduce the strength of the electromagnetic interference when propagating from inside of a portion of the data processing devices (102) to an ambient environment around the data processing devices (102) and/or other locations by at least 90 decibels or another suitable level of suppression. The suitable level of suppression may be between 15-30 decibels, 30-45 decibels, 45-60 decibels, 60-75 decibels, 75-90 decibels, or 90-120 decibels.

The electromagnetic interference isolation provided by the data processing devices (102) may have a frequency dependent response. For example, the data processing devices (102) may provide at least 90 decibels (dB), or another suitable level of isolation, across a frequency band in which devices that may be disposed within the data processing devices (102) are adapted to emit electromagnetic interference. In other frequency bands, the data processing devices (102) may provide different level or no electromagnetic interference isolation for devices disposed within the data processing devices (102).

Accordingly, a data processing device in accordance with one or more embodiments of the invention may provide electromagnetic interference suppression services that are frequency dependent. In one or more embodiments of the invention, a data processing device provides electromagnetic interference isolation by reducing the strength of electromagnetic interference across at least one frequency band by a predetermined amount (e.g., 90 decibels).

An electromagnetic interference emitting device may be any type of hardware device that intentionally emits electromagnetic radiation as part of its operation. The emissions of electromagnetic radiation may be, for example, continuous, periodic, or intermittent (e.g., at any point in time based on the operation of the respective electromagnetic interference emitting device). An electromagnetic interference emitting device may be, for example, a personal electronic device such as a cellular device (e.g., smart phone, cell phone, etc.), a personal computer (e.g., any type of computing device with wireless communications capabilities such as a tablet computer, a laptop computer, etc.), a watch (e.g., a wireless smart watch), or any other type of hardware device that intentionally emits electromagnetic radiation for any purpose (e.g., communications, detection, etc.).

The electromagnetic interference emitted by an electromagnetic interference emitting device may be frequency dependent. That is, the electromagnetic interference emitted by the electromagnetic interference emitting device may be stronger in a first frequency band and weaker in a second frequency band. To provide electromagnetic interference suppression services, a data processing device in accordance with one or more embodiments of the invention may attenuate the electromagnetic interference emitted by an electromagnetic interference emitting device by at least a predetermined amount (e.g., 80 decibels) across at least one frequency band in which the electromagnetic interference emitting device emits electromagnetic interference. The at least one frequency band may be, for example, the frequency band in which the emitted electromagnetic interference has a largest magnitude.

In one or more embodiments of the invention, an electromagnetic interference emitting device emits electromagnetic interference having frequency content between 700 megahertz and 10 gigahertz. An electromagnetic interference emitting device may emit electromagnetic interference having different frequency content without departing from the invention.

To further discuss aspects of embodiments of the disclosed technology, each component of the system of FIG. 1.1 is discussed below.

In one or more embodiments of the invention, the frame (100) is a physical structure. The physical structure may be adapted to facilitate storage of the data processing devices (102) in a high-density computing environment. The high-density computing environment may be, for example, a data center or another type of location where multiple data processing devices are located. To facilitate storage of the data processing devices (102), the frame (100) may include any number of structural members (e.g., beams, brackets, bars, etc.) and any number of mechanical mounting points (e.g., holes, threaded portions, etc.) disposed on the structural members to facilitate storage of the data processing devices (102).

Different structural members may have different shapes, sizes, and/or other physical characteristics. The shapes, sizes, and/or other physical characteristics of the structural members may be adapted to enable the structural members to be mechanically connected (e.g., permanently or reversibly connected) to each other to form a predetermined structure. The predetermined structure may be, for example, a cage, box, or other type of structure that facilitates positioning and/or orienting the data processing devices (102).

When all, or a portion, of the structural members are mechanically connected to each other, the mechanical mounting points may be disposed at predetermined locations. The predetermined locations may correspond to similar predetermination locations on the data processing devices (102) where mechanical mounting elements, complementary to the mechanical mounting point, are disposed. By doing so, the frame (100) and the data processing devices (102) may be adapted to position the data processing devices (102) in locations and/or orientations compatible with a high-density computing environment, or another environment in which the data processing devices (102) may be located.

The mechanical mounting points may be any type of physical structure for attaching (permanently or reversibly) the data processing devices (102) to the frame (100). There may be any number of mechanical mounting points to facilitate the attachment of any number of data processing devices.

The frame (100) may be implemented using any number of suitable materials. For example, portions of the frame (100) may be implemented using metals (e.g., steel, aluminum, etc.). In another example, portions of the frame (100) may be implemented using polymers (e.g., Polyamides, polycarbonates, polyester, polyethylene, polypropylene, polystyrene, polyurethanes, polyvinyl chloride, polyvinylidene chloride, acrylonitriline butadiene styrene, etc.). In a still further example, portions of the frame (100) may be implemented using rubber (e.g., latex, styrene-butadiene rubbers, etc). The frame (100) may be implemented using any quantity and combination of suitable materials without departing from the invention.

In one or more embodiments of the invention, the data processing devices (102) are physical structures. For example, the data processing devices (102) may include a chassis and one or more computing devices disposed within the chassis. For details regarding computing devices, refer to FIG. 6.

A chassis may be a mechanical device that is adapted to (i) facilitate attachment of the data processing device to the frame, (ii) house the one or more computing devices, (iii) house one or more electromagnetic interference emitting devices, and/or (iv) provide thermal management services to the computing devices and/or the electromagnetic interference emitting devices. For example, a chassis may be a frame mountable structure (e.g., a rectangular box) that includes internal space that may be used to house computing devices and/or electromagnetic interference emitting devices. Thus, the chassis may be a frame mountable chassis.

The chassis may be implemented using any number of suitable materials. For example, portions of the chassis may be implemented using metals (e.g., steel, aluminum, etc.). In another example, portions of the chassis may be implemented using polymers (e.g., Polyamides, polycarbonates, polyester, polyethylene, polypropylene, polystyrene, polyurethanes, polyvinyl chloride, polyvinylidene chloride, acrylonitriline butadiene styrene, etc). In a still further example, portions of the chassis may be implemented using rubber (e.g., latex, styrene-butadiene rubbers, etc.) The chassis may be implemented using any quantity and combination of suitable materials without departing from the invention.

To facilitate attachment of the data processing device to the frame, the chassis may include any number of mechanical mounting elements. The mechanical mounting elements may be located at predetermined locations. The predetermined locations may correspond to similar predetermination locations on the frame (100) where mechanical mounting points, complementary to the mechanical mounting elements, are disposed.

For example, a mechanical mounting element may be a rail disposed on a side of a chassis of a data processing device. The location of the rail may correspond to a position on the frame (100) where a rail guide (i.e., a complementary mechanical mounting point) is disposed. The rail and the rail guide may facilitate attachment of a data processing device to the frame (100) which, in turn, positions and orients the data processing device relative to the frame (100).

To house the one or more computing devices, the chassis may include one or more internal volumes. The internal volumes may facilitate disposing of the one or more computing devices (and/or other devices) within a data processing device.

To house the one or more electromagnetic interference emitting devices, the chassis may include one or more internal volumes. The internal volumes may have a shape or other characteristic(s) that facilitates disposing of the one or more electromagnetic interference emitting devices within the data processing device. For example, an internal volume of the chassis may be a rectangular void capable of housing one or more electromagnetic interference emitting devices.

In one or more embodiments of the invention, the one or more internal volumes of the data processing devices are adapted to restrict propagation of electromagnetic interference emitted by the electromagnetic interference emitting devices (and/or other devices such as computing devices). For example, one or more portions of the chassis that bound the one or more internal volumes may be made of metal of a predetermined thickness to prevent and/or limit transmission of electromagnetic interference through the one or more portions of the chassis. By doing so, the electromagnetic interference generated by the electromagnetic interference emitting devices may be prevented (or at least severely attenuated when leaving an internal volume) from propagating from within the data processing devices (102) into the ambient environment surrounding the respective data processing devices (102).

In another example, one or more portions of the chassis that bound the one or more internal regions may be formed in a manner that filters electromagnetic radiation when electromagnetic radiation passes through the portions of the chassis. For example, a portion of the chassis that bounds the one or more internal regions may be a waveguide filter such as an array of holes (e.g., sub-wavelength apertures corresponding to a particular frequency) in a metal sheet. By doing so, the electromagnetic interference generated by the electromagnetic interference emitting devices may be severely attenuated (e.g., attenuated by greater than 90 decibels) when propagating from within the data processing devices (102) into the ambient environment surrounding the respective data processing devices (102).

In a further example, one or more portions of the chassis that bound the one or more internal regions may be made of an electromagnetic radiation attenuating material of a predetermined thickness to prevent and/or limit transmission of electromagnetic interference through the one or more portions of the chassis. The electromagnetic radiation attenuating material may be, for example, a composite of plastic or rubber that includes particulates of iron, carbonyl iron, or other electromagnetically lossy material. By doing so, the electromagnetic interference generated by the electromagnetic interference emitting devices may be severely attenuated (e.g., attenuated by greater than 90 decibels or another suitable level of attenuation) when propagating from within the data processing devices (102) into the ambient environment surrounding the respective data processing devices (102).

To provide thermal management services to the computing devices and/or the electromagnetic interference emitting devices, the data processing devices (102) may facilitate the flow of gas proximate to the computing devices and/or electromagnetic interference emitting devices, By doing so, the thermal state (i.e., temperature) of the aforementioned devices may be regulated.

For example, a data processing device may include one or more vents that enable gas from a first side of a data processing device to flow into the data processing device, through the data processing device, and out of a second side of the data processing device. The gas, flowing through the data processing device, may be at a different temperature than the computing devices and/or electromagnetic interference emitting devices. Consequently, thermal exchange between the flow of gas and the aforementioned devices may occur resulting in the temperature of the aforementioned devices changing. By doing so, heat generated by the aforementioned devices may be expelled from the devices thereby regulating the temperature of the aforementioned devices to manage their respective thermal states.

A system in accordance with embodiments of the invention may include any number of data processing devices. Different data processing devices (102) may have different configurations and/or uses within the system.

For example, some data processing devices may be adapted to house many electromagnetic interference emitting devices while other data processing devices may be primarily adapted to house computing devices. Additional data processing devices may be adapted to exclusively house data processing devices and no electromagnetic interference emitting devices. A system in accordance with embodiments of the invention may include any number and combination of data processing devices adapted for any number of different uses without departing from the invention.

By way of example, the system of FIG. 1.1 may include a first data processing device (104). The first data processing device (104) may be of a larger size than a second data processing device (106) and, consequently, may be capable of housing a larger number of electromagnetic interference emitting devices. The system of FIG. 1.1 may further include a third data processing device (108). In contrast to the first data processing device (104) and the second data processing device (106), the internal structure of the third data processing device (108) may be adapted to only housing computing devices rather than electromagnetic interference generating devices.

For additional details regarding data processing devices, refer to FIGS. 1.2-3.2.

As discussed above, data processing devices (102) may house electromagnetic interference emitting devices. When so housed, the electromagnetic interference emitting devices may operate thereby generating electromagnetic interference. At different points in time, it may be useful to add or remove electromagnetic interference emitting devices to or from the data processing devices (102). To facilitate such additions and/or removals, different portions of the data processing devices (102) may be adapted to reversibly provide access to the internal volumes of the data processing devices.

For example, the different portions of the data processing devices (102) may be adapted to rotate, translate, or otherwise move with respect to the remaining portions of the data processing devices (102). When the different portions of the data processing devices (102) are in a first predetermination position and/or orientation, they may electromagnetically seal one or more internal volumes of the data processing devices (102). That is, they may limit the extent to which electromagnetic radiation within the internal volumes is able to propagate to an ambient environment. However, when the different portions of the data processing devices (102) are rotated, translated, and/or otherwise moved to a second predetermined position and/or orientation to enable access to the internal volumes, the data processing devices (102) may not be electromagnetically sealed. Consequently, electromagnetic radiation within the internal volumes may be less limited by the data processing devices (102) to propagate into the ambient environment when access to the internal volumes is provided.

The data processing devices (102) may include hinges, slides, knobs, and/or other mechanical devices that facilitate movement of the different portions of the data processing devices (102) to reversibly reconfigure the data processing devices (102) between states where access (i.e., physical accessibility) to the internal volumes of the data processing devices (102) is provided and states where access to the internal volumes of the data processing devices (102) is not provided. FIGS. 1.2-1.3 show diagrams of the data processing devices (102) facilitating the addition, modification, and/or removal of electromagnetic interference emitting devices from the internal volumes of the data processing devices (102).

While the system of FIG. 1.1 has been illustrated as including a limited number of components, a system in accordance with embodiments of the invention may include any number of frames, data processing devices, and/or other components without departing from the invention. For example, any number of frames (and/or other types of physical devices for positioning/orienting devices) may be used in a high density computing environment to facilitate the placement and/or orientation of any number of data processing devices. Further, the frames may be used to position and/or orient other types of devices. The other types of devices may be, for examples, servers, storage nodes, compute nodes, communication devices switches, routers, etc. for facilitating communications between any number of devices and/or devices external to a high density computing environment), or any other type of device that may be used in a computing environment (e.g., data center, computing nodes, communications center, etc.). Thus, the frame and data processing devices may be used in conjunction with any number and/or type of other device without departing from the invention.

FIG. 1.2 shows a diagram of the example system of FIG. 1.1 in a configuration (i.e., after a reconfiguration from the configuration illustrated in FIG. 1.1) where a front vent (110) of the first data processing device (104) has been opened. The front vent (110) may be opened by physically rotating and/or translating the front vent (110) to move the front vent (110) to a new physical location. By opening the front vent (110), physical access to internal volumes of the first data processing device (104) may be provided. Consequently, the internal configuration of the internal volumes of the first data processing device (104) may be modified. For example, electromagnetic interference emitting devices may be removed from and/or added to the internal volumes. Similarly, computing devices may be added to and/or removed from the internal volumes.

However, in the state illustrated in FIG. 1.2, the ability of the first data processing device (104) to limit propagation of and/or attenuate electromagnetic interference generated by electromagnetic interference emitting devices disposed within the first data processing device (104) may be compromised. In other words, the first data processing device (104) may be in an electromagnetic interference suppression compromised state that allows electromagnetic interference within internal volumes of the first data processing device (104) to propagate to the ambient environment around the first data processing device (104) without attenuation. In contrast, in the state illustrated in FIG. 1.1, the first data processing device (104) may be in an electromagnetic interference suppressed state (i.e., electromagnetic interference generated by the electromagnetic interference emitting devices may be contained within the internal volumes and/or attenuated by greater than 90 decibels when propagating out of the internal volumes).

In some embodiments of the invention, the first data processing device (104) automatically causes all, or a portion, of the electromagnetic interference emitting devices disposed within its internal volumes to suspend generation of electromagnetic interference when in the electromagnetic interference suppression compromised state illustrated in FIG. 12. By doing so, the first data processing device (104) may provide electromagnetic interference management services when the first data processing device (104) is in an electromagnetic interference suppression compromised state. All, or a portion, of the data processing devices of a system in accordance with embodiments of the invention may provide similar electromagnetic interference management services.

Similar to FIG. 1.2, FIG. 1.3 shows a diagram of the example system of FIG. 1.1 in a second configuration (i.e., after a reconfiguration from the configuration illustrated in FIG. 1.1) where a top door (112) of the second data processing device (106) has been opened after translating the second data processing device (106) with respect to the frame. The top door (112) may be all, or a portion, of the chassis that may be reversibly moved to enable access to internal volumes of the first data processing device (104).

Open the top door (112), for example, the second data processing device (106) may be mounted to the frame (100) via rails that enable the second data processing device (106) to translate with respect to the frame (100) via application of physical force. Once translated to a predetermined location, the top door (112) may be opened by application of physical force by a user.

By opening the top door (112), physical access to the internal volumes of the second data processing device (106) may be provided. Consequently, the internal configuration of the internal volumes of the second data processing device (106) may be modified. For example, electromagnetic interference emitting devices may be removed from and/or added to the internal volumes of the second data processing device (106). Similarly, computing devices may be added to and/or removed from the internal volumes of the second data processing device (106).

However, in the state illustrated in FIG. 1.3, the ability of the second data processing device (106) to limit propagation of and/or attenuate electromagnetic interference generated by electromagnetic interference emitting devices disposed within the second data processing device (106) may be compromised. In other words, the second data processing device (106) may be in an electromagnetic interference suppression compromised state that allows electromagnetic interference within internal volumes of the second data processing device (106) to propagate to the ambient environment around the second data processing device (106) without attenuation. In contrast, in the state illustrated in FIG. 1.1, the first data processing device (104) may be in an electromagnetic interference suppressed state (i.e., electromagnetic interference generated by the electromagnetic interference emitting devices may be contained within the internal volumes and/or attenuated by greater than 90 decibels when propagating out of the internal volumes).

In some embodiments of the invention, the second data processing device (106) automatically causes all, or a portion, of the electromagnetic interference emitting devices disposed within its internal volumes to suspend generation of electromagnetic interference when in the electromagnetic interference suppression compromised state illustrated in FIG. 1.3. By doing so, the second data processing device (106) may provide electromagnetic interference management services when the second data processing device (106) is in an electromagnetic interference suppression compromised state. All, or a portion, of the data processing devices of a system in accordance with embodiments of the invention may provide similar electromagnetic interference management services (e.g., automatically terminating and/or resuming the electromagnetic interference generation depending on the electromagnetic interference suppression state of the data processing device).

Thus, as illustrated in FIGS. 1.1-1.3, a system in accordance with embodiments of the invention may provide electromagnetic interference management services to devices disposed with the data processing devices when the data processing devices are in an electromagnetic interference suppression compromised state or an electromagnetic interference suppressed state.

As discussed above, a system in accordance with one or more embodiments of the invention may include one or more data processing devices. FIGS. 2.1-3.2 show diagrams of data processing devices in accordance with embodiments of the invention. FIGS. 2.1-2.4 show diagrams of the second data processing device (106) of FIG. 1.1 while FIGS. 3.1-3.2 show diagrams of the first data processing device (104).

FIG. 2.1 shows a diagram of the second data processing device (106) in accordance with one or more embodiments of the invention. As discussed above, the second data processing device (106) may provide electromagnetic interference management services for electromagnetic interference emitting devices disposed within the second data processing device (106). To do so, the second data processing device (106) may include a front vent (200), a rear vent (204), a support module (208), and a payload module (210). Each of these components of the second data processing device (106) is discussed below.

The front vent (200) may be a physical device for (i) enabling gas flow through the second data processing device (106) and (ii) limiting the propagation of electromagnetic interference from an internal volume of the second data processing device (106) and/or attenuating electromagnetic interference that propagates from an internal volume of the second data processing device (106) to an ambient environment around the second data processing device (106) via the front vent (200). For additional details regarding the internal volume and propagation of electromagnetic interference via the front vent (200), refer to FIGS. 2.2-2.4.

In one or more embodiments of the invention, the front vent (200) is a rectangular structure formed with holes (202) that enables gasses to flow between the ambient environment surrounding the second data processing device (106) and an internal volume of the second data processing device (106). By doing so, the second data processing device (106) may provide thermal management services to components disposed within the second data processing device (106) by controlling the flow of gasses from the ambient environment through the second data processing device (106).

For example, the second data processing device (106) may be used in a high-density computing environment in which a source of cool gas is supplied to a first side of the second data processing device (106). In such an environment, the second data processing device (106) may cause cool gas to flow into the second data processing device (106) via the front vent (200) and exhaust the cool gas (which may be at a higher temperature after exchanging heat as the gas traverses the second data processing device (106)) by flowing out a second side of the second data processing device (106) (e.g., out of the support module (208)). Alternatively, the second data processing device (106) may cause a reverse gas flow, of that discussed above, if the source of cool gas is supplied proximate to the support module (208) rather than proximate to the front vent (200).

The structure of the front vent (200) may also be adapted to limit propagation of electromagnetic radiation through the front vent (200) and/or attenuate electromagnetic radiation that propagates through the front vent (200). For example, the size, position, number, shape, and/or other characteristics of the holes (202) through the front vent may be adapted to (i) limit propagation of electromagnetic radiation and/or (ii) attenuate propagating electromagnetic radiation. In another example, the thickness and material choice of the front vent (200) may be adapted to (i) limit propagation of electromagnetic radiation and/or (ii) attenuate propagating electromagnetic radiation. By being so adapted, the front vent (200) may attenuate electromagnetic radiation that propagates through the front vent (200) by at least 90 decibels.

In one or more embodiments of the invention, the rear vent (204) is similar to the front vent (200). For example, the rear vent (204) may provide similar attenuation and/or restriction of propagation of electromagnetic radiation while enabling gasses to flow between internal volumes of the second data processing device. The rear vent (204) may have a similar structure to that of the front vent (200). However, the structure (e.g., different hole pattern, thickness, hole type, etc.) and/or electromagnetic (e.g., attenuation and/or reflection of electromagnetic radiation) and/or hydrodynamic (e.g., impedance to fluid flow) characteristics of the rear vent (204) may be different from the front vent (200) without departing from the invention. For additional details regarding vents, refer to FIGS. 4.1-4.6.

The payload module (210) may be a physical device for (i) housing electromagnetic interference devices, (ii) limiting propagation of electromagnetic interference from internal volumes of the second data processing device (106) to the ambient environment surrounding the second data processing device (106), and (iii) thermally regulating devices disposed within the payload module (210). For additional details regarding the payload module (210), refer to FIGS. 2.2-2.4.

The support module (208) may be a physical device for housing devices that provide services to devices disposed within the payload module (210). For example, the support module (208) may house one or more power supplies, gas flow control devices, communications devices, and/or computing devices. The aforementioned devices may provide corresponding services to devices disposed in other portions of the second data processing device (106) and/or devices located in other locations (i.e., external to the second data processing device (106).

The one or more power supplies may supply power to other devices. For example, the power supplies may provide power to electromagnetic interference devices disposed within the payload module, other types of devices (e.g., computing device) disposed within the payload module, and/or devices located in other areas of the second data processing device.

The one or more power gas flow control components may provide thermal management services to other devices. For example, the gas flow control components may regulate the flow of gasses through the second data processing device. The gas flow control components may include fans (or other types of active flow control devices), gas flow monitoring sensors, and/or other types of components to manage gas flow.

The one or more power communication devices may provide communication services to other devices. For example, the communication devices may manage network interfaces that enables the electromagnetic interference emitting devices disposed within the payload module (210) to communicate with other devices (e.g., computing devices that may be controlling the operation of the electromagnetic interference emitting devices).

The one or more computing devices may manage the operations of the other entities of the second data processing device (106). For example, the computing devices may send messages to the electromagnetic interference emitting devices to perform predetermined functionality. Such messages, when received by the electromagnetic interference emitting devices may cause the electromagnetic interference emitting devices to stop and/or start emitting electromagnetic interference.

The computing devices may send such instructions when (or around the time when) the electromagnetic interference suppression state of the second data processing device (106) is changed (i.e., when portions of the second data processing device (106) are physically reconfigured). The computing devices may make such determinations based on any number of sensors (not shown) that monitor the physical configuration of the second data processing device (106). The sensors may be disposed, for example, in the payload module, on the vents (e.g., 200, 204), or at other locations such that measurements by the sensors indicate the thermal state of components of the second data processing device for which thermal management services (e.g., monitoring the thermal state of components and taking actions such as modifying the rate of gas flow to manage the thermal state of the components) are being provided.

In another example, the computing devices may send messages to fan controllers (not shown) or other devices that manage the operation of gas flow control devices disposed within the second data processing device (106). The computing devices may send such messages based on the thermal state (i.e., temperature) of one or more devices disposed within the second data processing device (106). The computing devices may monitor such thermal states using any number of sensors (not shown) and/or based on messages received from the one or more devices disposed within the second data processing device (106).

In response to receipt of such messages, the fan controllers or other devices may modify the operational state of the gas flow control devices. By doing so, the computing devices may change the thermal state of devices disposed within the second data processing device (106) by controlling the flow of gasses through the second data processing device (106).

To manage the operation of the other entities of the second data processing device (106), one or more processors of the computing devices may execute instructions (e.g., computer code), stored on a persistent storage, that cause the computing devices to perform all, or a portion, of the method illustrated in FIG. 5. For additional details regarding computing devices, refer to FIG. 6.

To further clarify aspects of embodiments of the invention, a cut-view diagram of the second data processing device (106) in accordance with one or more embodiments of the invention is shown in FIG. 2.2. In FIG. 2.2, the second data processing device (106) has been cut along the X-Y plane illustrated in FIG. 2.1 and a portion, defined by the X-Y plane, has been removed to expose portions of the internal structure of the second data processing device (106).

As seen from FIG. 2.2, the payload module (210) may include an internal volume (214). The internal volume (214) may be used to house devices such as electromagnetic interference emitting devices, supports for such devices, and/or other devices that may provide services to the electromagnetic interference emitting devices and/or other devices.

The internal volume (214) may be bounded, on four sides, by portions of the payload module (210). For example, the internal volume (214) may be bounded by a top door (212), a bottom (218), a first side (216), and a second side (not shown). These four components of the payload module (210) may define a rectangular shape of the internal volume (214).

The internal volume (214) may be further bounded, on a fifth and sixth size, by the front vent (200) and the rear vent (204). The front vent (200) and the rear vent (204) may be on opposite sides of the internal volume (214). By doing so, the front vent (200) and the rear vent (204) may define an gas flow path through the payload module (210). For example, gasses may be able to flow between the two vents through the internal volume (214). As discussed above, to control such gas flows, fans, or other gas flow control devices, may be disposed in the support module (208). Gas flow control devices may be disposed in other locations (e.g., in the payload module, on an exterior of the front vent (200), etc.) to control the flow of gasses through the payload module (210) without departing from the invention.

While the payload module (210) and internal volume (214) have been illustrated as having a rectangular shape, the aforementioned components may be of different types of shapes without departing from the invention. Further, while the front vent (200) and the rear vent (204) have been described as being disposed on opposite sides of the internal volume (214), the vents may be located at other locations to define gas flow paths of different shapes without departing from the invention. For example, the rear vent (204) may be aligned with the bottom (218), the top door (212), or the sides (e.g., 216) to define an gas flow path having a turn (rather than being a straight line).

The gas flow path through the internal volume (214) may be of any shape without departing from the invention. The internal volume (214) may include any number of gas flow paths (i.e., the internal volume (214) may be bounded by additional vents other than the front vent (200) and the rear vent (204)).

To further clarify aspects of embodiments of the invention, FIGS. 2.3-2.4 illustrate examples of the second data processing device (106) where the internal volume (214) has been partially filled with devices.

FIG. 2.3 shows a cut-view diagram, similar to that of FIG. 2.2, where an electronics payload (220), a tray (222), and multiple electromagnetic interference emitting devices (224) have been placed in the internal volume. Such devices may have been placed in the internal volume (214) by utilizing the top door (212).

The electronics payload (220) may be a physical device. The electronics payload (220) may be, for example, an access point. The access point may enable the electromagnetic interference emitting devices (224) to communicate with other devices using a wireless link between the access point and the electromagnetic interference emitting devices (224). For example, the access point may support a local area network via wireless connections between the electronics payload (220) and the electromagnetic interference emitting devices (224).

The electronics payload (220) may be disposed at a location within the internal volume (214, FIG. 2.1) to facilitate wireless communications between the electronics payload (220) and the electromagnetic interference emitting devices (224). The electronics payload (220) may be connected to other devices (e.g., the Internet) via any combination of wired and/or wireless networks. For example, the electronics payload (220) may be operably connected to a router (connected to the Internet) via a wired connection.

The tray (222) may be a physical device. The tray (222) may position and/or orient any number of electromagnetic interference emitting devices (224) disposed within the internal volume (214, FIG. 2.2). For example, the tray (222) may be a sheet of material mechanically connected to the walls, bottom, top, vents, or any other physical components of the second data processing device.

The tray (222) may include physical, optical, or any other type of indicator for positioning any number of the electromagnetic interference emitting devices (224) on the tray. For example, the tray (222) may include indentations corresponding to a shape of the electromagnetic interference emitting devices (224). By doing so, any number of electromagnetic interference emitting devices (224) may be positioned and/or oriented within the internal volume of the second data processing device.

The example disposition of electromagnetic interference emitting devices (224) within the second data processing device illustrated in FIG. 2.3 may be considered to be in a low-density state. That is, the internal volume is relatively sparsely populated with electromagnetic interference emitting devices (224).

In contrast, FIG. 2.4 shows a second example of electromagnetic interference emitting devices (224) and trays (226) in a high-density state. That is, the internal volume of the second data processing device may include numerous electromagnetic interference emitting devices (224). In the state illustrated in FIG. 2.4, large amounts of electromagnetic interference and heat may be generated by the electromagnetic interference emitting devices (224). However, the electromagnetic interference generated by the electromagnetic interference emitting devices (224) may be generally contained within the internal volume of the second data processing devices.

For example, electromagnetic radiation of the electromagnetic interference impinging on the top door, the sides, and the bottom of the second data processing device may be locked (i.e., reflected towards the internal volume) within the internal volume rather than being allowed to propagate to the ambient environment surrounding the internal volume. Electromagnetic radiation of the electromagnetic interference impinging on the front vent and the rear vent may, similarly, be locked (i.e., reflected towards the internal volume) within the internal volume and/or attenuated by at least 90 decibels as the electromagnetic radiation propagates through the vents and into the ambient environment surrounding the second data processing device. Consequently, the electromagnetic interference emitting devices (224) disposed within the internal volume of the second data processing device may be isolated from the ambient environment surrounding the second data processing device by at least 90 decibels.

While the second data processing device has been illustrated as including a limited number of components disposed in specification locations and orientations in FIGS. 2.3 and 2.4, a data processing device in accordance with embodiments of the invention may include any number of electromagnetic interference emitting devices (224), any number of other positioning devices (e.g., trays or other mechanical structure for positioning purposes), any number of electronics payloads (e.g., 220), and/or other types of devices (e.g., other computing devices) in any orientation and disposed at any location without departing from the invention.

To further clarify aspects of embodiments of the invention, FIGS. 3.1-3.2 show diagrams of the first data processing device (104) of FIG. 1.1. As discussed above, different types of data processing devices may have different structures, be of different sizes and/or shapes, and may be adapted to house different types of devices.

FIG. 3.1 shows a cut-view diagram of the first data processing device (104) in accordance with one or more embodiments of the invention. The view of FIG. 3.1 may be similar to that of FIG. 2.1 (i.e., utilizing an X-Y plane similar positioned as in FIG. 2.1). As discussed above, the first data processing device (104) may provide electromagnetic interference management services for electromagnetic interference emitting devices disposed within the first data processing device (104). To do so, the first data processing device (104), like the second data processing device (106, FIG. 1.1) may include a front vent (302), a rear vent (304), a support module (308), and a payload module (310).

These components, similarly named to those illustrated in FIG. 2.1, may perform similar functions. However, due to size differences between the first and second data processing devices, the payload module (310) may enable a different internal configuration to be used within the internal volume of the payload module (310).

For example, like the second data processing device, the first data processing device (104) may include trays (332). The trays (332) may be disposed further from one another when compared to the trays illustrated in FIG. 2.4. By doing so, electromagnetic interference emitting devices may be differently oriented when compared to FIGS. 2.3 and 2.4. Such orientation differences may be made when placing the electromagnetic interference devices via a top door (312) or other reconfigurable portion of the first data processing device.

Additionally, due to the larger size of the internal volume, multiple electronic payloads (320) may be disposed within the internal volume. Like the electronic payloads discussed with respect to FIG. 2.3, each of the electronic payloads (320) may facilitate communications between the electromagnetic interference emitting devices disposed within the first data processing device (104) and other devices. For example, the electronics payloads (320) may be access points that support operable wireless connections with the electromagnetic interference emitting devices. While illustrated in FIG. 3.1 as only including two such electronics payloads, a data processing device may include any number of electronics payloads without departing from the invention. Each of the electronics payloads may perform similar and/or different functions. For example, some electronics payloads may provide communication services while other may provide, for example, thermal management services.

Each of the electronics payloads (320) may provide such services to any number of electromagnetic interference emitting devices. FIG. 3.2 shows a diagram of the first data processing device (104) in accordance with one or more embodiments of the invention. As seen in FIG. 3.2, the first data processing device (104) is in a high-density state where numerous electromagnetic interference emitting devices (334) have been added to its internal volume.

In this state, the electronics payloads (320) may provide services (e.g., communication, thermal, etc.) to the electromagnetic interference emitting devices (334). For example, different portions of the electromagnetic interference emitting devices (334) disposed proximate to each of the respective electronics payloads (320) may utilize the services provided by the respective proximate electronics payloads (320). In another example, the electronics payloads (320) may logically divide the electromagnetic interference emitting devices (334) into different groups to which the respective electronics payloads (320) provide services. The groupings may be dynamically changed to appropriately load balance the services provided by each of the electronics payloads (320) as the demand for services changes over time.

For example, depending on the workloads being performed by each of the electromagnetic interference emitting devices (334), the services utilized by the respective electromagnetic interference emitting devices (334) may dynamically change. The electronics payloads (320) may update the logical divisions of the electromagnetic interference emitting devices (334) according to the dynamically changing services demands of the electromagnetic interference emitting devices (334).

Additionally, as seen from FIG. 3.2, the orientation of the electromagnetic interference emitting devices (334) may be different from that illustrated in FIG. 2.4. Consequently, the density of the electromagnetic interference emitting devices (334) may be improved and/or the orientation of the electromagnetic interference emitting devices (334) may be different to meet other goals (e.g., connectivity between the electromagnetic interference emitting devices (334) and the electronics payloads (320)).

As discussed with respect to FIGS. 2.1-3.2, data processing devices may utilize events to electromagnetically isolate internal volumes from ambient environments. FIGS. 4.1-4.6 show diagrams of vents in accordance with one or more embodiments of the invention may be used to facilitate electromagnetic isolation of internal volumes.

FIG. 4.1 shows a diagram of an example vent in accordance with one or more embodiments of the invention. The front vent and/or the rear event discussed with respect to FIG. 2.1 may be similar to the example vent of FIG. 4.1.

The example vent may be a physical device. The example vent may be adapted to (i) interact with electromagnetic radiation in a manner that enables an electromagnetically isolated internal volume to be formed, (ii) enable gas to pass through the example vent, and/or (iii) facilitate reversible electromagnetic seals between the example vent and other components (e.g., a chassis) to be reliably formed. To provide the aforementioned functionality, the example vent may include a body (400) and a gas flow pattern (408).

The body (400) may be a physical device. For example, the body (400) may be a volumetric structure with a shape that is complementary to a portion of the chassis with which the example vent will interact.

Consider a scenario where a chassis includes a rectangular hole for receiving the example vent. In such a scenario, the body (400) of the example vent may have a rectangular shape such that, when placed in the hole for receiving the example vent, the body (400) fills the rectangular hole. When filling the rectangular hole, an electromagnetic seal between the chassis in the body (400) may be formed. Consequently, once the example vent is disposed in the rectangular hole, propagation of electromagnetic radiation through the hole may be prevented and/or electromagnetic radiation may be severely attenuated when propagating through the hole filled with the example vent.

In one or more embodiments of the invention, the body (400) is formed from a reversibly deformable material. The reversibly deformable material may deform under application of physical force. For example, if the shape of the body (400) is slightly larger than the corresponding hole for receiving the body (400), the shape of the body (400) may deform to enable the body (400) to be firmly placed within the hole for receiving the body (400). By deforming to adopt the shape of the hole for receiving the body (400), a seal between the body (400) and the contours of the hole may be formed. Consequently, an electromagnetic seal between the body (400) and the contours of the hole may be formed.

Additionally, the body (400) may be formed of an electromagnetically lossy material. For example, an electromagnetically lossy material may be included in the reversibly deformable material. Thus, the reversibly deformable material may be a composite material.

In one or more embodiments of the invention, the reversibly deformable material includes a silicone (i.e., polysiloxanes). The reversibly deformable material may tend to return to an initial state prior mechanical deformation. That is, strain or other forces may tend to return a shape of the reversibly deformable material to a previous shape after mechanical deformation.

In one or more embodiments of the invention, the reversibly deformable material includes an elastomer. The elastomer may be, for example, natural polyisoprenes synthetic polyisoprene, polybutadiene, chloroprene, polychloroprene, neoprene, baypren, butyl rubber, styrene-butadiene, nitrile rubber, ethylene propylene rubber, epichlorohydrin rubber, polyacrylic tubber, silicone rubber, fluorosilicone, fluoroelastomers, polyether block aamides, chlorosulfonated polyethylene, ethylene-vinyl acetate, thermoplastic elastomers, polysulfide rubber, elastolefin, polydimethylsulfide, etc.

In one or more embodiments of the invention, the reversibly deformable material includes particulates (i.e., a composite material). The particulates may range in size from nanometer scale particles (i.e., particles having a size of less than 1000 nanometers) to microscale particles (i.e., particles having a size of less than 100 micrometers).

The reversibly deformable material may include a sufficient quantity of particulates to cause the particulates to modify the electromagnetic characteristics of the composite material. For example, the reversibly deformable material may include particulates of 0-20% by volume.

In one or more embodiments of the invention, the composite reversibly deformable material is an electromagnetically lossy material. For example, the particulates may be formed from an electromagnetically lossy material such as carbonyl iron (and/or other lossy dielectric (e.g., Kanthal or other iron-chromium-aluminum alloys) and/or lossy magnetic (e.g., iron ferrites) materials). The composite reversibly deformable material may have an electric loss tangent of between 0.01-0.5 and/or a magnetic loss tangent of between 0.01-0.5 in the frequency range in which electromagnetic interference emitting devices emit electromagnetic interference (e.g., 0.7-10 gigahertz). In one or more embodiments of the invention, the composite reversibly deformable material has electrical loss tangent of greater than 0.1 and a magnetic loss tangent of greater than 0.5 in the frequency range in which electromagnetic interference emitting devices emit electromagnetic interference.

The composite reversibly deformable material may have a real permittivity of between 1-50 and a real permeability of between 0.5-5 in the frequency range in which electromagnetic interference emitting devices emit electromagnetic interference (e.g., 0.7-10 gigahertz). The composite reversibly deformable material may be electromagnetically dispersive (i.e., complex permittivity and permeability vary over the frequency range in which electromagnetic interference emitting devices emit electromagnetic interference (e.g., 0.7-10 gigahertz)).

In a scenario in which the body (400) has a rectangular shape, the body (400) may have a height (404), a width (406), and the thickness (402). The height (404) and the width (406) may be adapted to enable the body (400) to have a cross-section that is complementary to a corresponding portion of the chassis of the data processing device. In other words, the height and width of the body (400) may match that of a corresponding portion of the chassis. In some embodiments of the invention the height and the width of the body (400) may be slightly larger than the corresponding portion of the chassis to create an interference between the body (400) and the chassis. By doing so, the likelihood of creating an electromagnetic seal between the body (400) and the chassis may be improved when compared to attempting to generate an electromagnetic seal without an interference (e.g., mechanical difference in size between two components).

The thickness (402) may be adapted to meet electromagnetic radiation isolation requirements. For example, by virtue of being made of an electromagnetic lossy material, the body (400) may attenuate electromagnetic radiation as it propagates through the thickness of the body (400). To meet electromagnetic radiation isolation requirements, the thickness (402) of the body may be set to cause electromagnetic radiation that propagates through the thickness (402) of the body (400) to be attenuated by a predetermined amount (e.g., 30 dB, 45 dB, 60 dB, 75 dB, 90 dB, 105 dB, 120 dB, etc.).

In one or more embodiments of the invention, the gas flow pattern (408) is a two-dimensional pattern that defines the openings of gas flow paths that enable gases to pass through the body (400). For additional details regarding gas flow paths, refer to FIG. 4.2. For additional information regarding gas flow patterns, refer to FIG. 4.4.

FIG. 4.2 shows a cross-section diagram of the example vent of FIG. 4.1. As seen in FIG. 4.2, the gas flow pattern (408) may define the openings of gas flow paths (410). The gas flow paths (410) may be hollow paths through the thickness (402) of the body. The gas flow paths (410) may facilitate the flow of gas through the thickness (402) of the body (400).

While the gas flow paths (410) were illustrated in FIG. 4.2 as an array of straight through-holes corresponding to the gas flow pattern (408), numerous variations are possible without departing from the invention.

For example, the gas flow paths (410) may have other shapes, rather than being straight through-holes, without departing from the invention. FIG. 4.3 shows a second cross-section diagram of the body (400) that includes non-linear gas flow paths (412). A non-linear gas flow path may have a shape that varies along the thickness of the body. For example, each of the non-linear gas flow paths (412) may have a shape of a conic section (i.e., a truncated cone with a smaller diameter corresponding to the elements of the gas flow pattern (408)).

Non-linear gas flow paths may have two impacts on the operation of the vent. First, such paths may have a more favorable impedance to gas flow through the thickness when compared to straight through holes. Second, such paths may modulate the rate at which electromagnetic radiation propagating through the thickness (402) is attenuated and/or reflected. For example, the diameter of the non-linear gas flow paths (412) proximate to the internal volume may impact the front face electromagnetic impedance presented to electromagnetic radiation propagating within the internal volume. Consequently, a smaller diameter hole may preferentially reflect electromagnetic radiation when compared to a larger diameter hole. Thus, a non-linear gas flow path may have a reduced impedance to the flow of gasses while preferentially reflecting electromagnetic radiation (rather than allowing propagation) so long as the smaller diameter hole of the non-linear gas flow path is proximate to the internal volume.

While the gas flow paths of the body have been illustrated as being straight through holes or truncated conic sections, the gas flow paths of the body may have other shapes without departing from the invention. For example, the gas flow paths may be spirals, may be through-holes that are at acute angles to the surface of the thickness (402) (rather than being at right angles as illustrated in FIG. 4.1), or may have more complicated shapes.

FIG. 4.4 shows a front view diagram of the body (400) of FIG. 4.1. As seen in FIG. 4.4 the gas flow pattern (408) may include gas flow pattern elements (409) distributed across a face of the body (400). The gas flow pattern (408) on each face may be different (e.g., when the shape of the gas flow paths varies along the thickness of the body (400)).

While the gas flow pattern (408) in FIG. 4.4 is illustrated as a two-dimensional array of circular gas flow pattern elements, numerous variations are possible without departing from the invention. For example, the pattern of gas flow pattern elements (409) may not be in a periodic pattern, different gas flow pattern elements of the gas flow pattern (408) may have different shapes, etc. To further clarify such variations, examples of gas flow patterns in accordance with one or more embodiments of the invention are illustrated in FIGS. 4.5-4.6.

FIG. 4.5 shows a second front view diagram of the body (400) of FIG. 4.1. As seen in FIG. 4.5, the body (400) includes a non-linear gas flow pattern (420). The non-linear gas flow pattern (420) includes circular gas flow pattern elements that are distributed across the width (406) and height (404) of the body (400) at locations corresponding to gas flow control device shadows (422).

A gas flow control device shadow may be a portion of the width (406) and height (404) of the body (400) that will be proximate to a gas flow control device when the body (400) is disposed in a chassis. In FIG. 4.5, the gas flow control device shadows (422) correspond to ducts of two fans (i.e., gas flow control devices) that may be disposed proximate to the body (400) inside of a chassis of a data processing device. Consequently, because of the future placement of the ducts of the two fans with respect to the body (400), only the gas flow pattern elements (e.g., 409) proximate to the ducts are likely to facilitate gas flow through the thickness of the body (400) when the vent is in use. Thus, the non-linear gas flow pattern (420) may only include gas flow pattern elements (e.g., 409) positioned within/proximate to the gas flow control device shadows (422).

By only including gas flow control pattern elements (e.g., 409) proximate to the gas flow control device shadows (422), the body (400) illustrated in FIG. 4.5 may have improved electromagnetic radiation attenuation properties and/or improved stiffness when compared to the body (400) illustrated in FIG. 4.4.

FIG. 4.6 shows a third front view diagram of the body (400) of FIG. 4.1. As seen in FIG. 4.6, the body (400) includes a non-linear, asymmetric gas flow pattern (430). The non-linear, asymmetric gas flow pattern (430) may include gas flow pattern elements (e.g., 409) of different shapes and sizes. Each of the gas flow pattern elements (e.g., 409) may be located proximate to gas flow control device shadows (422) and has a shape and size adapted to maximize the amount of gas that may traverse through the thickness of the body (i.e., minimize the hydrodynamic impedance of the body (400) along its thickness (402)).

By doing so, embodiments of the invention may provide a body (400) that attenuates propagating electromagnetic radiation to facilitate creation of electromagnetically isolated internal volumes while minimizing the impedance to the flow of gasses through the body (400).

Thus, as illustrated in FIGS. 1.1-4.6, a system in accordance with embodiments of the invention may facilitate the inclusion of numerous electromagnetic interference emitting devices in a high-density environment. Such electromagnetic interference emitting devices may be included for any purposes (e.g., testing of the electromagnetic interference emitting devices, data processing production, etc.).

To further clarify aspects of embodiments of the invention, a method that may be performed in conjunction and/or separately from the system of FIG. 1.1 is illustrated in FIG. 5. The aforementioned method may be performed when providing electromagnetic interference management services.

FIG. 5 shows a flowchart of a method in accordance with one or more embodiments of the invention. The method depicted in FIG. 5 may be used to manage the thermal state of electromagnetic interference emitting devices disposed in a data processing device in accordance with one or more embodiments of the invention. The method shown in FIG. 5 may be performed completely, or in part, by, for example, data processing devices (e.g., 102, FIG. 1.1). Other components of the system illustrated in FIG. 1.1 may perform all, or a portion, of the method of FIG. 5 without departing from the invention.

While FIG. 5 is illustrated as a series of steps, any of the steps may be omitted, performed in a different order, additional steps may be included, and/or any or all of the steps may be performed in a parallel and/or partially overlapping manner without departing from the invention.

In step 500, the thermal state of an electromagnetic interference emitting device is monitored.

In one or more embodiments of the invention, the thermal state of the electromagnetic interference emitting device is monitored based on data provided by electromagnetic interference emitting device. For example, electromagnetic interference emitting device may provide its thermal state. The thermal state may reflect the temperature of electromagnetic interference emitting device.

In one or more embodiments of the invention, the thermal state of the electromagnetic interference emitting device is monitored using a thermal sensor. The thermal sensor may be disposed at a location where the thermal state of an electromagnetic interference emitting device to be monitored.

In one or more embodiments of the invention, the thermal state of the electromagnetic interference emitting device is monitored over time. For example, the thermal state may be monitored while the electromagnetic interference emitting device is performing one or more tasks. The tasks may be, for example, to simply operate in a predetermined state.

In step 502, the thermal state of the electromagnetic interference emitting device is managed based on the monitoring by modulating a rate of gas flow through an internal volume delineated by two vents. For example, the two vents may define an gas flow path through the internal volume.

In one or more embodiments of the invention, the gas flow is modulated by changing settings of a gas flow control component. For example, the gas flow control component may be a fan. The gas flow may be modulated by increasing or decreasing a rate at which the fan is turning.

In one or more embodiments of the invention, each of the two vents is an electromagnetic radiation absorbing vent. For example, the two vents may be similar to a vent as discussed with respect to FIGS. 4.1-4.6.

In one or more embodiments of the invention, the two vents have different gas flow patterns. For example, a front vent of the two vents may have a two-dimensional gas flow pattern. In contrast, a rear vent of the two vents may have a nonlinear gas flow pattern. The nonlinear gas flow pattern may be asymmetrical. For example, the nonlinear gas flow pattern may have gas flow pattern elements that are proximate to a gas flow control device shadow caused by the gas flow control component.

In one or more embodiments of the invention, the gas flow control component is disposed outside of the internal volume.

The method may end following step 502.

Figure 6:
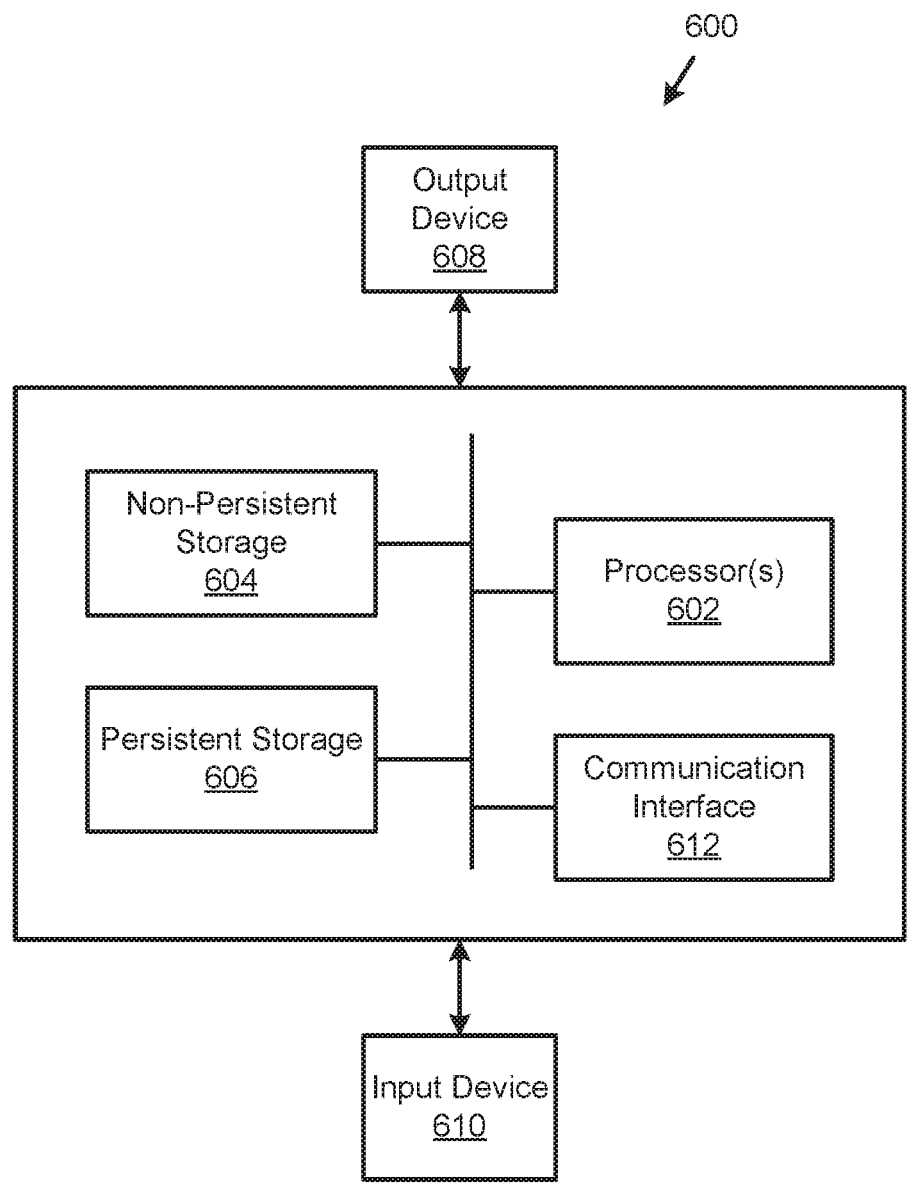
FIG. 6 shows a diagram of a computing device in accordance with one or more embodiments of the invention.

As discussed above, embodiments of the invention may be implemented using computing devices. FIG. 6 shows a diagram of a computing device in accordance with one or more embodiments of the invention. The computing device (600) may include one or more computer processors (602), non-persistent storage (604) (e.g., volatile memory, such as random access memory (RAM), cache memory), persistent storage (606) (e.g., a hard disk, an optical drive such as a compact disk (CD) drive or digital versatile disk (UM) drive, a flash memory, etc.), a communication interface (612) (e.g., Bluetooth interface, infrared interface, network interface, optical interface, etc.), input devices (610), output devices (608), and numerous other elements (not shown) and functionalities. Each of these components is described below.

In one embodiment of the invention, the computer processor(s) (602) may be an integrated circuit for processing instructions. For example, the computer processor(s) may be one or more cores or micro-cores of a processor. The computing device (600) may also include one or more input devices (610), such as a touchscreen, keyboard, mouse, microphone, touchpad, electronic pen, or any other type of input device. Further, the communication interface (612) may include an integrated circuit for connecting the computing device (600) to a network (not shown) (e.g., a local area network (LAN), a wide area network (WAN) such as the Internet, mobile network, or any other type of network) and/or to another device, such as another computing device.

In one embodiment of the invention, the computing device (600) may include one or more output devices (608), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (602), non-persistent storage (604), and persistent storage (606). Many different types of computing devices exist, and the aforementioned input and output device(s) may take other forms.

Embodiments of the invention may provide a method, system, and device for managing electromagnetic interference. A system in accordance with embodiments of the invention may manage electromagnetic interference at a data processing device level. That is, such a data processing device may include functionality to limit the propagation of electromagnetic interference from within data processing devices to an ambient environment surrounding the data processing device. By doing so, such data processing devices may be used in a high-density environment without negatively impacting the functionality of the high-density environment.

Additionally, embodiments of the invention may provide an electromagnetic interference suppressed internal volume delineated by vents. The vents may be formed from a reversibly deformable material that attenuates propagating electromagnetic radiation. Thus, the vents may electromagnetically isolate the internal volume from an ambient environment by attenuating propagating electromagnetic radiation from within the internal volume rather than merely reflecting the electromagnetic radiation.

Thus, embodiments of the invention may address the problem of electromagnetic interference within a high-density environment. Specifically, embodiments of the invention may provide a data processing device level solution that facilitates granular control of electromagnetic interference in the aforementioned environments.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the data management device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A data processing device, comprising:
   an internal volume for housing electromagnetic interference (EMI) emitting devices, wherein the EMI emitting devices comprise hardware devices that emit EMI; and
   two electromagnetic radiation (EMR) absorbing vents that delineate a gas flow path through the internal volume,
   wherein a first EMR absorbing vent of the EMR absorbing vents comprises a first plurality of gas flow paths,
   wherein the first plurality of gas flow paths comprises hollow portions of a body that comprises an EMR lossy material,
   wherein the first plurality of gas flow paths is delineated by a gas flow pattern on a surface of the body,
   wherein a second EMR absorbing vent of the EMR absorbing vents comprises a second plurality of gas flow paths,
   wherein the second plurality of gas flow paths is delineated by a non-linear gas flow pattern on a surface of a second body that comprises a second EMR lossy material, and
   wherein the lossy material has a real permittivity of a range between 1 and 50 for EMI in a frequency range at least 0.7 and less than 2 gigahertz.

2. The data processing device of claim 1, wherein the internal volume is adapted to suppress EMI transmission from within the internal volume to an ambient environment.

3. The data processing device of claim 1, wherein at least one of the two EMR absorbing vents comprises a reversibly deformable material.

4. The data processing device of claim 1, wherein the EMR lossy material has an electrical loss tangent of greater than 0.1.

5. The data processing device of claim 1, wherein the EMR lossy material has a magnetic loss tangent of greater than 0.5.

6. The data processing device of claim 1, wherein the non-linear gas flow pattern is asymmetric.

7. The data processing device of claim 1, wherein the non-linear gas flow pattern corresponds to a shadow of a gas flow control device hosted by the data processing device, wherein the gas flow control device is a fan disposed outside of the internal volume.

* * * * *